(12) United States Patent
Baker

(10) Patent No.: US 9,070,469 B2
(45) Date of Patent: Jun. 30, 2015

(54) DIGITAL FILTERS WITH MEMORY

(75) Inventor: R. Jacob Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 992 days.

(21) Appl. No.: 12/941,878

(22) Filed: Nov. 8, 2010

(65) Prior Publication Data
US 2011/0051511 A1    Mar. 3, 2011

Related U.S. Application Data

(62) Division of application No. 11/818,989, filed on Jun. 15, 2007, now Pat. No. 7,830,729.

(51) Int. Cl.
| | |
|---|---|
| *G11C 16/26* | (2006.01) |
| *G11C 7/02* | (2006.01) |
| *G11C 7/06* | (2006.01) |
| *G11C 7/10* | (2006.01) |
| *G11C 11/56* | (2006.01) |
| *G11C 29/02* | (2006.01) |
| *G11C 13/00* | (2006.01) |
| *G11C 16/04* | (2006.01) |

(52) U.S. Cl.
CPC *G11C 16/26* (2013.01); *G11C 7/02* (2013.01); *G11C 7/067* (2013.01); *G11C 7/1006* (2013.01); *G11C 7/1051* (2013.01); *G11C 7/106* (2013.01); *G11C 7/1069* (2013.01); *G11C 11/56* (2013.01); *G11C 11/5642* (2013.01); *G11C 11/5678* (2013.01); *G11C 13/0004* (2013.01); *G11C 16/04* (2013.01); *G11C 29/02* (2013.01); *G11C 29/023* (2013.01); *G11C 29/028* (2013.01); *G11C 2211/5634* (2013.01)

(58) Field of Classification Search
CPC ...... G11C 16/26; G11C 7/1006; G11C 11/56; G11C 11/5678; G11C 29/028; G11C 7/106; G11C 7/02; G11C 11/5642; G11C 29/023; G11C 29/02; G11C 7/1051; G11C 7/067; G11C 7/1069; G11C 16/04; G11C 13/0004; G11C 2211/5634
USPC .................................. 365/45, 46, 48, 185.03
See application file for complete search history.

(56) References Cited

U.S. PATENT DOCUMENTS

| | | | |
|---|---|---|---|
| 4,460,982 | A | 7/1984 | Gee et al. |
| 5,218,569 | A | 6/1993 | Banks |
| 5,600,319 | A | 2/1997 | Ginetti |
| 5,614,856 | A | 3/1997 | Wilson et al. |
| 5,627,784 | A | 5/1997 | Roohparvar |
| 5,748,535 | A | 5/1998 | Lin et al. |

(Continued)

OTHER PUBLICATIONS

Fairchild Semiconductor, "74AC163-74ACT163 Synchronous Presettable Binary Counter," datasheet. Feb. 2000. pp. 1-11.*

(Continued)

*Primary Examiner* — J. H. Hur
(74) *Attorney, Agent, or Firm* — Fletcher Yoder, P.C.

(57) ABSTRACT

A memory device that, in certain embodiments, includes a memory element coupled to a bit-line and a quantizing circuit coupled to the memory element via the bit-line. In some embodiments, the quantizing circuit includes an analog-to-digital converter having an input and output and a digital filter that includes memory. The input of the analog-to-digital converter may be coupled to the bit-line, and the output of the analog-to-digital converter may be coupled to the digital filter.

20 Claims, 22 Drawing Sheets

(56) References Cited

U.S. PATENT DOCUMENTS

| | | | |
|---|---|---|---|
| 5,953,276 | A | 9/1999 | Baker |
| 5,973,956 | A | 10/1999 | Blyth et al. |
| 6,044,019 | A | 3/2000 | Cernea et al. |
| 6,097,637 | A | 8/2000 | Bauer et al. |
| 6,188,340 | B1 | 2/2001 | Matsumoto et al. |
| 6,282,120 | B1 | 8/2001 | Cernea et al. |
| 6,466,476 | B1 | 10/2002 | Wong et al. |
| 6,490,200 | B2 | 12/2002 | Cernea et al. |
| 6,504,750 | B1 | 1/2003 | Baker |
| 6,567,297 | B2 | 5/2003 | Baker |
| 6,594,186 | B2 | 7/2003 | Kodaira |
| 6,661,708 | B2 | 12/2003 | Cernea et al. |
| 6,664,708 | B2 | 12/2003 | Shlimak et al. |
| 6,741,502 | B1 | 5/2004 | Cernea |
| 6,781,906 | B2 | 8/2004 | Perner et al. |
| 6,785,156 | B2 | 8/2004 | Baker |
| 6,795,359 | B1 | 9/2004 | Baker |
| 6,798,705 | B2 | 9/2004 | Baker |
| 6,813,208 | B2 | 11/2004 | Baker |
| 6,822,892 | B2 | 11/2004 | Baker |
| 6,826,102 | B2 | 11/2004 | Baker |
| 6,829,188 | B2 | 12/2004 | Baker |
| 6,847,234 | B2 | 1/2005 | Choi |
| 6,850,441 | B2 | 2/2005 | Mokhlesi et al. |
| 6,856,564 | B2 | 2/2005 | Baker |
| 6,870,784 | B2 | 3/2005 | Baker |
| 6,901,020 | B2 | 5/2005 | Baker |
| 6,914,838 | B2 | 7/2005 | Baker |
| 6,930,942 | B2 | 8/2005 | Baker |
| 6,954,390 | B2 | 10/2005 | Baker |
| 6,954,391 | B2 | 10/2005 | Baker |
| 6,985,375 | B2 | 1/2006 | Baker |
| 7,002,833 | B2 | 2/2006 | Hush et al. |
| 7,009,901 | B2 | 3/2006 | Baker |
| 7,095,667 | B2 | 8/2006 | Baker |
| 7,102,932 | B2 | 9/2006 | Baker |
| 7,133,307 | B2 | 11/2006 | Baker |
| 7,151,701 | B2 | 12/2006 | Combe et al. |
| 7,538,702 | B2 | 5/2009 | Baker |
| 7,667,632 | B2 | 2/2010 | Baker |
| 7,768,868 | B2 | 8/2010 | Baker |
| 7,817,073 | B2 | 10/2010 | Baker |
| 8,149,646 | B2 * | 4/2012 | Baker ............ 365/236 |
| 2002/0101758 | A1 | 8/2002 | Baker |
| 2002/0194557 | A1 | 12/2002 | Park |
| 2003/0039162 | A1 | 2/2003 | Baker |
| 2003/0043616 | A1 | 3/2003 | Baker |
| 2003/0067797 | A1 | 4/2003 | Baker |
| 2003/0198078 | A1 | 10/2003 | Baker |
| 2003/0214868 | A1 | 11/2003 | Baker |
| 2004/0008555 | A1 | 1/2004 | Baker |
| 2004/0032760 | A1 | 2/2004 | Baker |
| 2004/0062100 | A1 | 4/2004 | Baker |
| 2004/0076052 | A1 | 4/2004 | Baker |
| 2004/0095839 | A1 | 5/2004 | Baker |
| 2004/0190327 | A1 | 9/2004 | Baker |
| 2004/0190334 | A1 | 9/2004 | Baker |
| 2004/0199710 | A1 | 10/2004 | Baker |
| 2004/0240294 | A1 | 12/2004 | Baker |
| 2005/0002249 | A1 | 1/2005 | Baker |
| 2005/0007803 | A1 | 1/2005 | Baker |
| 2005/0007850 | A1 | 1/2005 | Baker |
| 2005/0013184 | A1 | 1/2005 | Baker |
| 2005/0018477 | A1 | 1/2005 | Baker |
| 2005/0018512 | A1 | 1/2005 | Baker |
| 2005/0041128 | A1 | 2/2005 | Baker |
| 2005/0088892 | A1 | 4/2005 | Baker |
| 2005/0088893 | A1 | 4/2005 | Baker |
| 2005/0201145 | A1 | 9/2005 | Baker |
| 2006/0013040 | A1 | 1/2006 | Baker |
| 2006/0062062 | A1 | 3/2006 | Baker |
| 2006/0227641 | A1 | 10/2006 | Baker |
| 2006/0250853 | A1 | 11/2006 | Taylor et al. |
| 2008/0310236 | A1 | 12/2008 | Baker |

OTHER PUBLICATIONS

Fischer et al., "Sigma-Delta Modulation," excerpt from Wiley Encylcopedia of Electrical and Electronics Engineering. 1999. pp. 244-254.*

Shigematsu et al., "A 1-V High-Speed MTCMOS Circuit Scheme for Power-Down Application Circuits," IEEE Journal of Solid-State Circuits, vol. 32, No. 6. Jun. 1997. pp. 861-869.*

Rane Corporation, RaneNote 137, "Digital Charma of Audio A/D Converters," 1997, 12 pgs.

Baker, R.J., (2001-2006) Sensing Circuits for Resistive Memory, presented at various universities and companies.

Baker, "CMOS Mixed Signal Circuit Design," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "Demystifying Sigma-Delta ADCs," (Jan. 31, 2003), 15 pgs.

Baker, R.J., (2003) Mixed-Signal Design in the Microelectronics Curriculum, IEEE University/Government/Industry Microelectronics (UGIM) Symposium, Jun. 30-Jul. 2, 2003.

Baker, R.J. (2004) Delta-Sigma Modulation for Sensing, IEEE/EDS Workshop on Microelectronics and Electron Devices (WMED), Apr. 2004.

Baker, "CMOS Circuit Design, Layout, and Simulation," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

Hadrick, M. and Baker, R.J., (2005) Sensing in CMOS Imagers using Delta-Sigma Modulation, a general presentation of our work in this area.

Baker, R.J. (2005) Design of High-Speed CMOS Op-Amps for Signal Processing, IEEE/EDS Workshop on Microelectronics and Electron Devices (WMED), Apr. 2005.

Leslie, M.B., and Baker, R.J., (2006) "Noise-Shaping Sense Amplifier for MRAM Cross-Point Arrays," IEEE Journal of Solid State Circuits, vol. 41, No. 3, pp. 699-704.

Duvvada, K., Saxena, V., and Baker, R. J., (2006) High Speed Digital Input Buffer Circuits, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) Design and Fabrication of a MEMS Capacitive Chemical Sensor System, proceedings of the IEEE/EDS Workshop on Microelectronics and Electron Devices (WMED), pp. 17-18, Apr. 2006.

Baker, R.J. and Saxena, V., (2007) Design of Bandpass Delta Sigma Modulators: Avoiding Common Mistakes, presented at various universities and companies.

Wikipedia —definition of "Error detection and correction", pulled from website Jun. 1, 2007, 9 pgs.

Wikipedia —definition of "Hamming code", pulled from website Jun. 1, 2007, 8 pgs.

Wikipedia —definition of "Linear feedback shift register (LFSR)," pulled from website Jun. 1, 2007, 4 pgs.

Park, "Motorola Digital Signal Processors—Principles of Sigma-Delta Modulation for Analog-to-Digital Converters," (Undated).

* cited by examiner

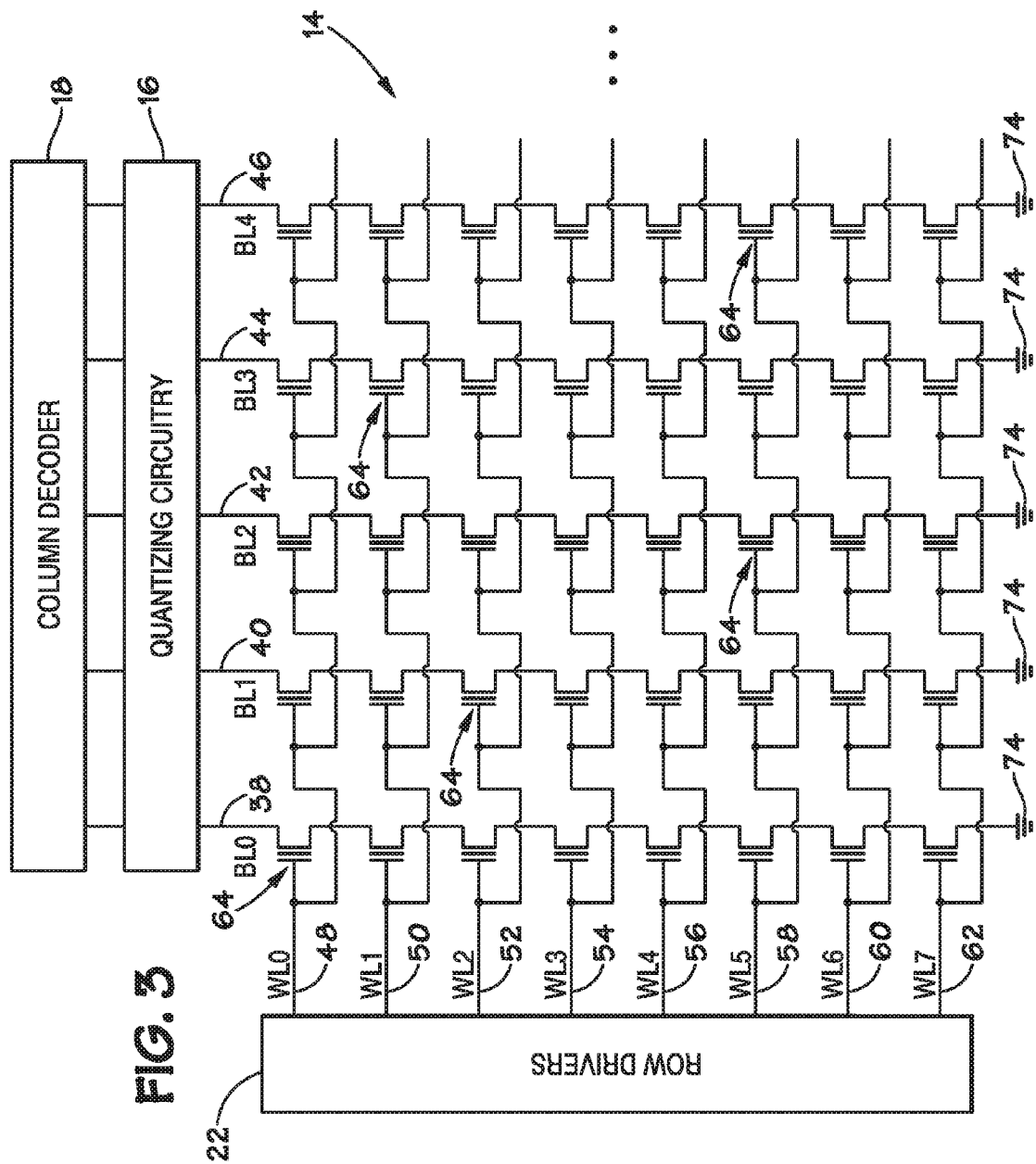

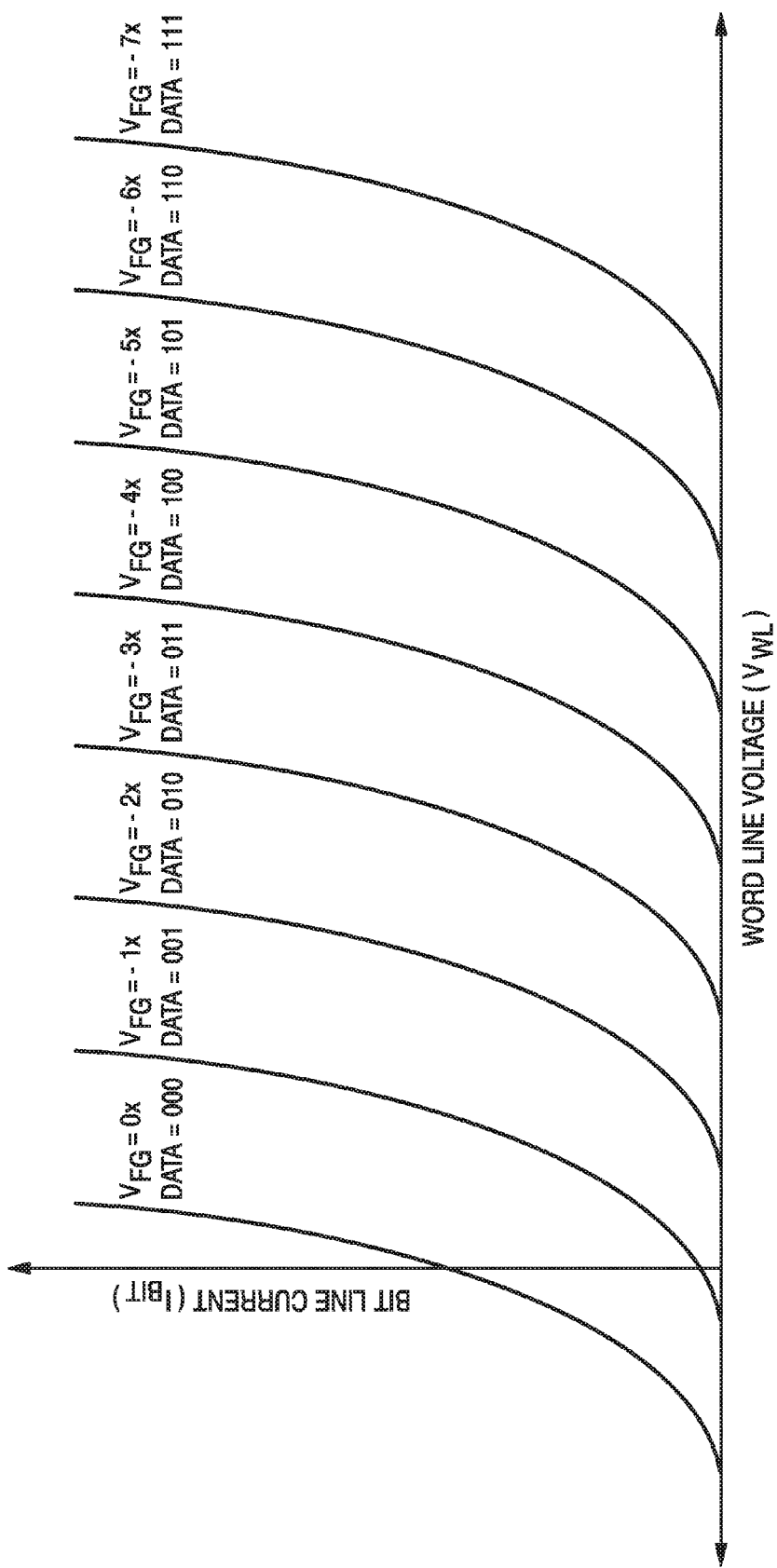

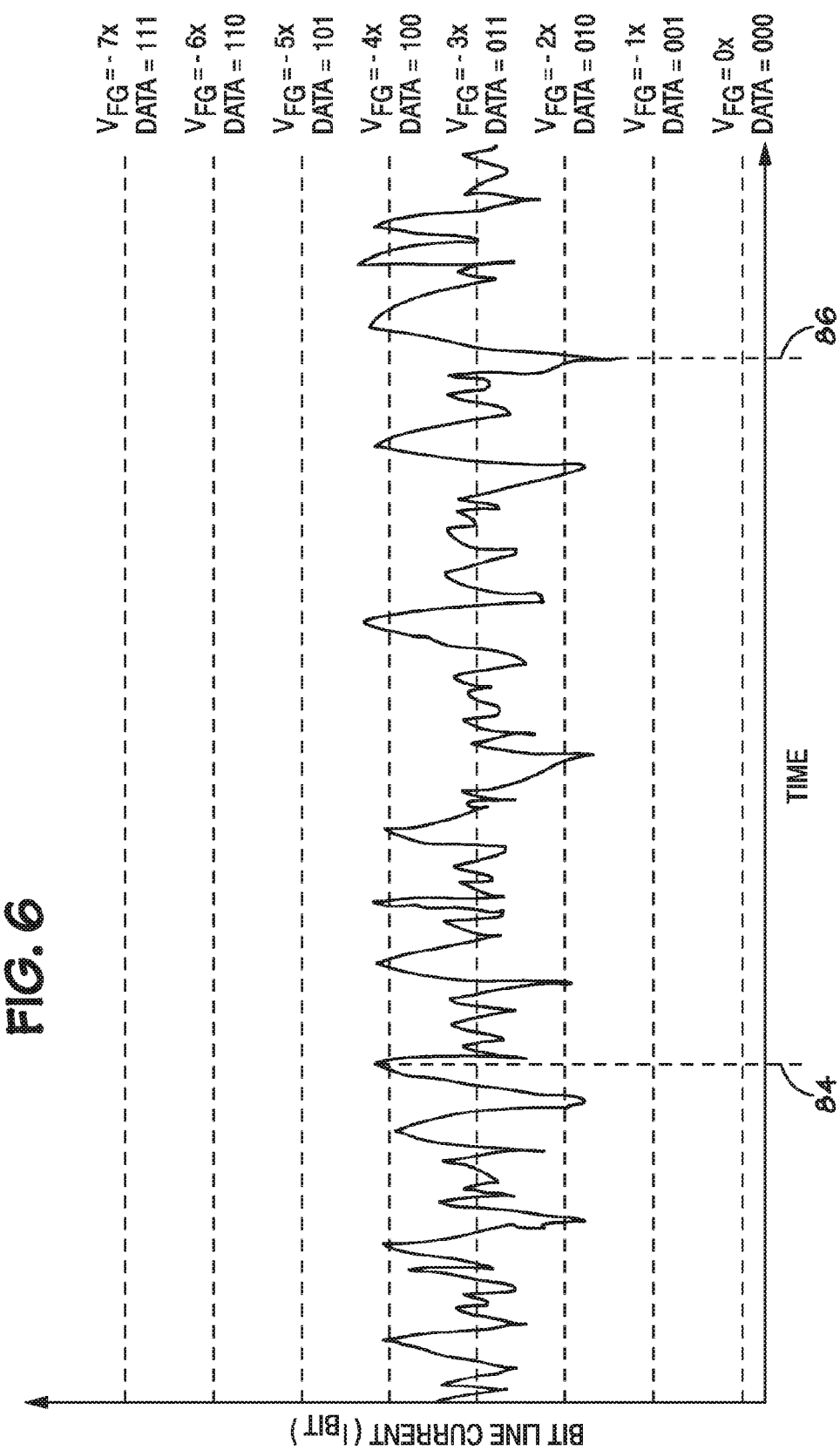

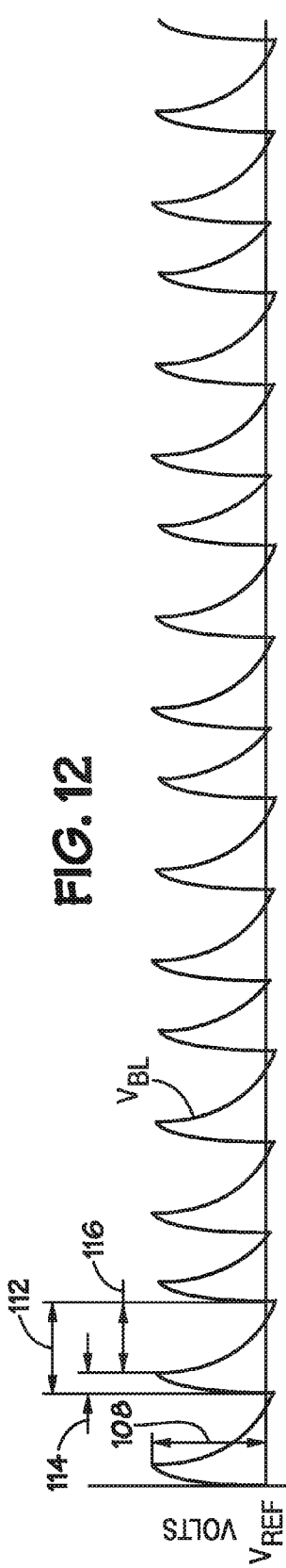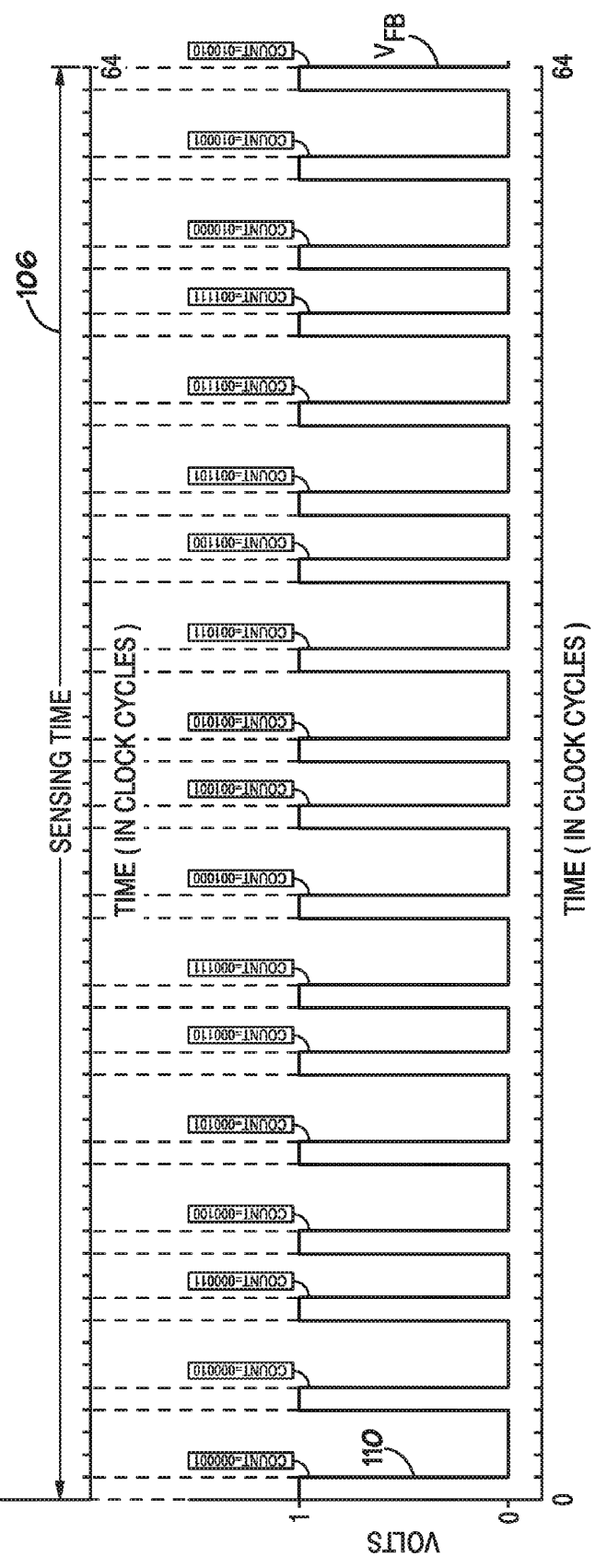
FIG. 12

DIGITAL FILTERS WITH MEMORY

CROSS-REFERENCE TO RELATED APPLICATION

This Application Is A Divisional Of U.S. patent application Ser. No. 11/818,989, Which Was Filed On Jun. 15, 2007.

BACKGROUND

1. Field of the Invention

Embodiments of the present invention relate generally to memory devices, and, more specifically, to digital filters with memory for reading from, and/or writing to, memory elements in memory devices.

2. Description of the Related Art

Generally, memory devices include an array of memory elements and associated sensing circuits. The memory elements store data, and the sensing circuits read the data from the memory elements. To read data, for example, a current is passed through the memory element, and the current or a resulting voltage is measured by the sensing circuit. Conventionally, the sensing circuit measures the current or voltage by comparing it to a reference current or voltage. Depending on whether the current or voltage is greater than the reference, the sensing circuit outputs a value of one or zero. That is, the sensing circuit quantizes or digitizes the analog signal from the memory element into one of two logic states.

The sensing circuit also provides feedback when writing to the memory element. In some memory devices, writing is an iterative process in which a value is written to the memory element by incrementally changing some property of the memory element, such as charge stored on a floating gate. After each iteration, the sensing circuit reads from the memory element to determine whether the changed property reflects the target value to be written to the memory element. If the property indicates the proper value, then the process of incrementally changing the property stops. Otherwise, the property is changed by another increment, and the sensing circuit reads from the memory element, repeating the process until the memory element stores the target value. Thus, each time data is written to the memory element, the sensing circuit may both read from the memory element and compare the resulting value to a target value several times.

Certain conventional sensing circuits can slow the writing process. These sensing circuits request and receive the target value over an input/output bus each time that they compare the target value to the value stored by the memory element. Acquiring the target value over the input/output bus can take several clock cycles. As a result, these sensing circuits may increase the time between each iteration of the writing process and, as a result, slow the operation of the memory device.

Additionally, some conventional sensing circuits include comparison circuitry that increases the size of memory devices, which tends to increase their cost. Certain conventional sensing circuits include comparison circuitry that, during a write operation, compares the target value to the value stored by the memory element. For multi-bit memory elements, the comparison circuitry may compare each digit of a multi-bit target value to each digit of a multi-bit value stored by the memory element. Circuitry configured to compare each digit may consume valuable chip surface area, especially in sensing circuits designed to sense multi-bit memory elements.

BRIEF DESCRIPTION OF THE DRAWINGS

FIG. 3 illustrates a memory array in accordance with an embodiment of the present invention;

FIG. 5 illustrates I-V traces of memory elements storing different values, in accordance with an embodiment of the present invention;

FIG. 6 illustrates noise in the bit-line current during a read operation;

FIGS. 11-13 illustrate voltages in the quantizing circuit of FIG. 8 when sensing small, medium, and large currents, respectively;

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sensing circuits discussed above. Some embodiments include a quantizing circuit configured to detect small differences in voltages and/or currents. In certain embodiments, the quantizing circuit may include a digital filter, such as a counter, with memory. As explained below, the memory in the digital filter may expedite write operations by locally storing the values to be written to a memory element. Additionally, in some embodiments, the memory may store a preset value used to initialize the counter such that a relatively simple circuit may be used to determine whether the memory element stores the target value being written.

The following description begins with an overview of examples of systems that employ quantizing circuits in accordance with embodiments of the present invention, and the problems within these systems that may be addressed by the quantizing circuits, as described with reference to FIGS. 1-7. Then, a specific example of a quantizing circuit is described with reference to FIGS. 8-15, and a specific example of a counter with memory is described with reference to FIGS. 16 and 17. Finally, an example of a read operation and several examples of a write operation are described with reference to FIGS. 18-23.

Figure 1:
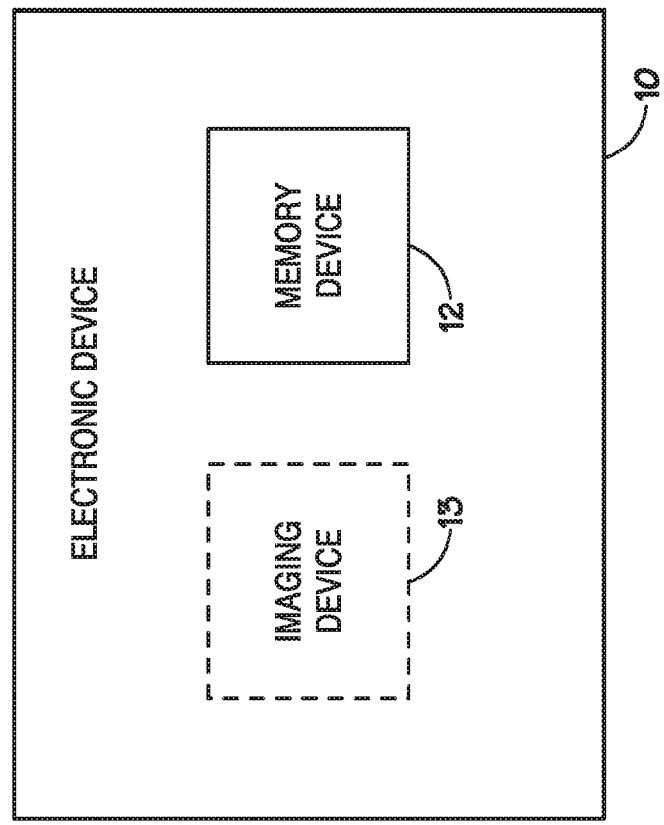
FIG. 1 illustrates an electronic device in accordance with an embodiment of the present invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
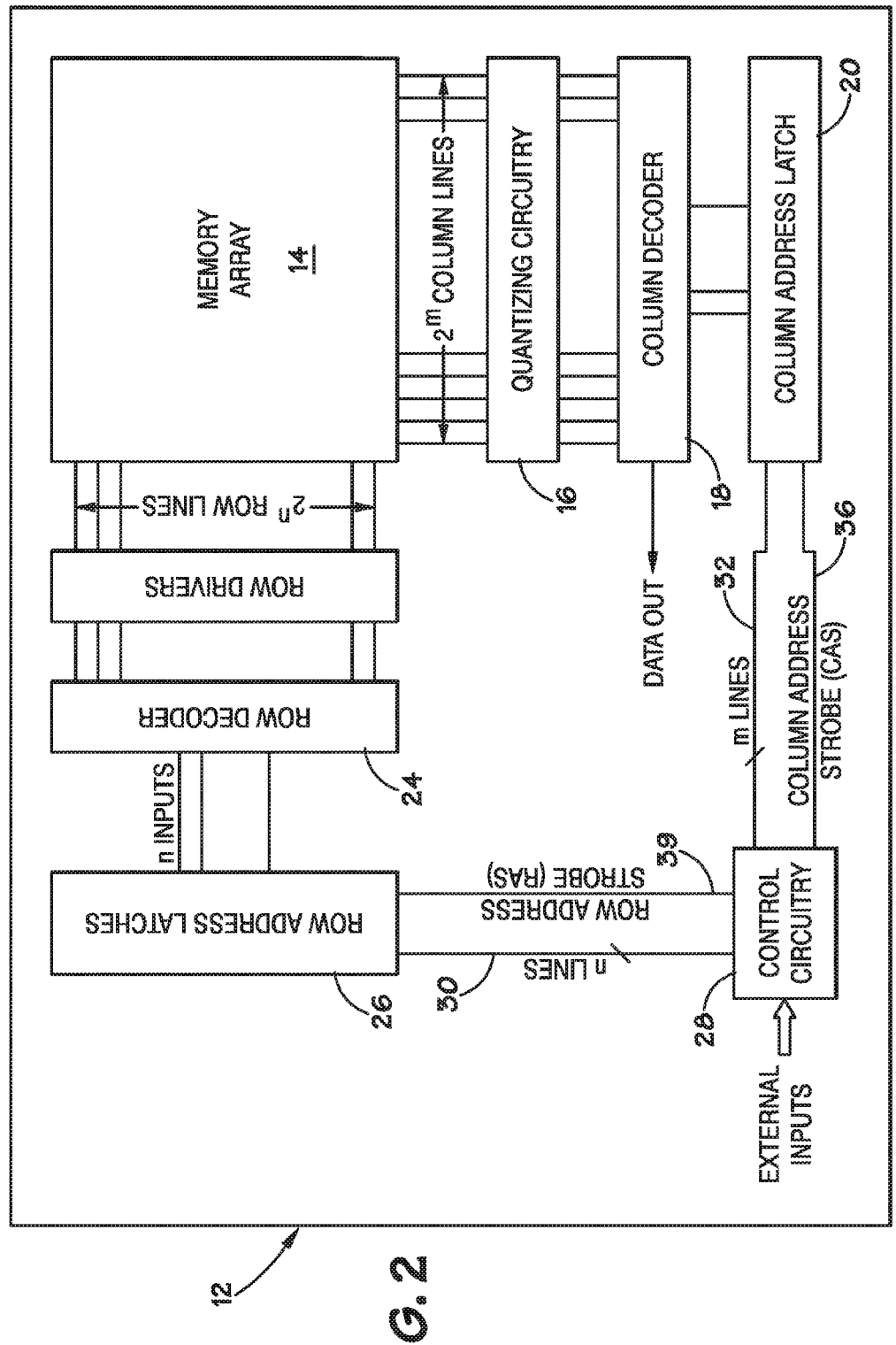
FIG. 2 illustrates a memory device in accordance with an embodiment of the present invention.

FIG. 2 depicts a block diagram of an embodiment of the memory device 12. The illustrated memory device 12 may include a memory array 14, a quantizing circuit 16, a column decoder 18, a column address latch 20, row drivers 22, a row decoder 24, row address latches 26, and control circuitry 28. As described below with reference to FIG. 3, the memory array 14 may include a matrix of memory elements arranged in rows and columns. As will be appreciated, the imaging device 13 (FIG. 1) may include similar features except that in the case of an imaging device 13, the memory array 14 will include a matrix of imaging elements, such as complementary-metal-oxide semiconductor (CMOS) imaging elements.

When accessing the memory elements, the control circuitry may receive a command to read from or write to a target memory address. The control circuitry 28 may then convert the target address into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 34 (or other controlling clock signal) may be asserted by the control circuitry 28, and the row address latches 26 may latch the transmitted row address. Similarly, the control circuitry 28 may assert a column address strobe 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds with the latched column address, and the quantizing circuit 16 may sense a voltage or current on the selected column. Additional details of reading and writing are described below.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are electrical conductors. The memory array 14 further includes a plurality of memory elements 64, each of which may be arranged to intersect one of the bit-lines and one of the word-lines. In other embodiments, imaging elements may be disposed at each of these intersections. The memory elements and imaging elements may be referred to generally as internal data storage locations, i.e., devices configured to convey data, either stored or generated by a sensor, when accessed by a sensing circuit, such as the quantizing circuits discussed below. The internal data storage locations may be formed on an integrated semiconductor device that also includes the other components of the memory device 12 (or imaging device 13).

In some embodiments, the illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase change memory or magnetoresistive memory. In another example, the memory elements 64 may include a capacitor, such as a stacked or trench capacitor. Some types of memory elements 64 may include an access device, such as a transistor or a diode associated with each of the memory elements 64, or the memory elements 64 may not include an access device, for instance in a cross-point array.

Figure 4:
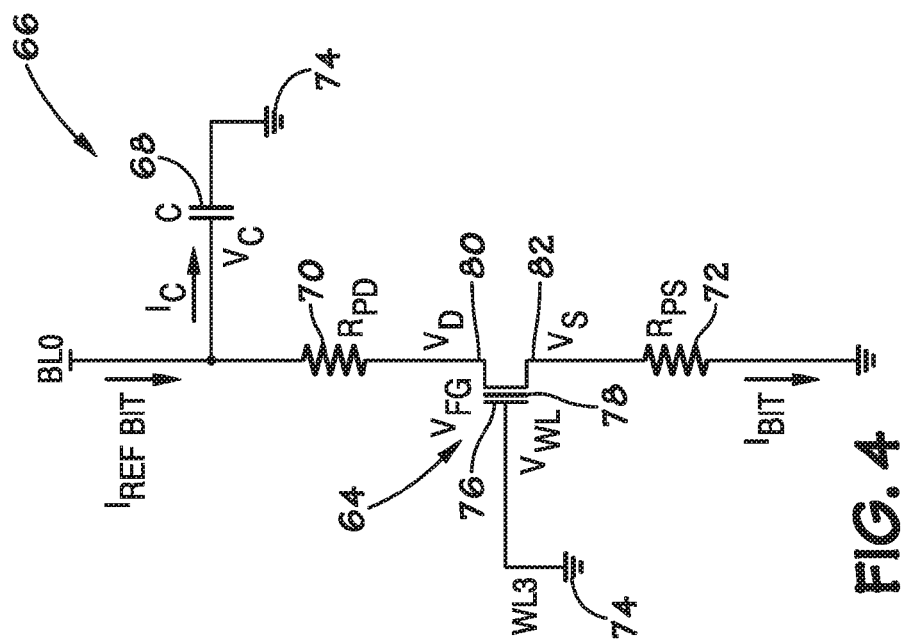
FIG. 4 illustrates a memory element in accordance with an embodiment of the present invention.

FIG. 4 illustrates a circuit 66 that models the operation of an arbitrarily selected memory element 64, which is disposed at the intersection of WL3 and BL0. This circuit 66 includes a capacitor 68, a pre-drain resistor 70 ($R_{PD}$), a post-source resistor 72 ($R_{PS}$), and a ground 74. The resistors 70 and 72 model the other devices in series the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is coupled to WL3. The pre-drain resistor 70, the drain 80, the source 82, and the post-source resistor 72 are disposed in series on the bit-line BL0. The capacitor 68, which models the capacitance of the bit-line, has one plate coupled to ground 74 and another plate coupled to the bit-line BL0, in parallel with the memory elements 64.

Several of the components of the circuit 66 represent phenomenon affecting the memory elements 64 during operation. The pre-drain resistor 70 generally represents the drain-to-bitline resistance of the memory elements 64 coupled to the bit-line above (i.e., up current from) WL3 when these memory elements 64 are turned on, (e.g., during a read operation). Similarly, the post source resistor 72 generally corresponds to the source-to-ground resistance of the memory elements 64 coupled to the bit-line below WL3 when these memory element 64 is selected. The circuit 66 models electrical phenomena associated with reading the memory elements 64 at the intersection of WL3 and BL0.

The operation of the memory elements 64 will now be briefly described with reference to FIGS. 4 and 5. FIG. 5 illustrates one potential relationship between the bit-line current ($I_{Bit}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store and output data by exploiting this effect.

To write data to the memory elements 64, a charge corresponding to the data may be stored on the floating gate 78. The charge of the floating gate 78 may be modified by applying voltages to the source 82, drain 80, and/or gate 76 such that the resulting electric fields produce phenomenon like Fowler-Northam tunneling and/or hot-electron injection near the floating gate 78. Initially, the memory elements 64 may be erased by manipulating the word-line voltage to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and measuring a resulting bit-line current, $I_{Bit}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of 1x representing a binary data value of 001, and so on through $V_{FG}$ of 7x, which represents a binary data value of 111. Thus, by applying a voltage to the gate 76 and measuring the resulting bit-line current, the charge stored on the floating gate 78 may be measured, and the stored data may be read.

The accuracy with which the bit-line current is sensed may affect the amount of data that a designer attempts to store in each memory element 64. For example, in a system with a low sensitivity, a single bit may be stored on each memory element 64. In such a system, a floating gate voltage $V_{FG}$ of 0x may correspond to a value of 0, and a floating gate voltage $V_{FG}$ of −7x may correspond to a value of one. Thus, the difference in floating gate voltages $V_{FG}$ corresponding to different data values may be relatively large, and the resulting differences and bit-line currents for different data values may also be relatively large. As a result, even low-sensitivity sensing circuitry may discern these large differences in bit-line current during a read operation. In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may correspond to a different three-bit value: 000, 001, 010, 011, 100, 101, 110, or 111. Thus, circuitry that precisely measures the bit-line current $I_{BIT}$ may allow a designer to increase the amount of data stored in each memory element 64.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$ and the bit-line current $I_{BIT}$. To illustrate these effects, FIG. 6 depicts noise on the bit-line while reading from the memory element 64. As illustrated, noise in the bit-line current $I_{BIT}$ may cause the bit-line current $I_{BIT}$ to fluctuate. Occasionally, the fluctuation may be large enough to cause the bit-line current $I_{BIT}$ to reach a level that corresponds with a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise on the bit-line may cause erroneous readings from memory elements 64.

Figure 7:
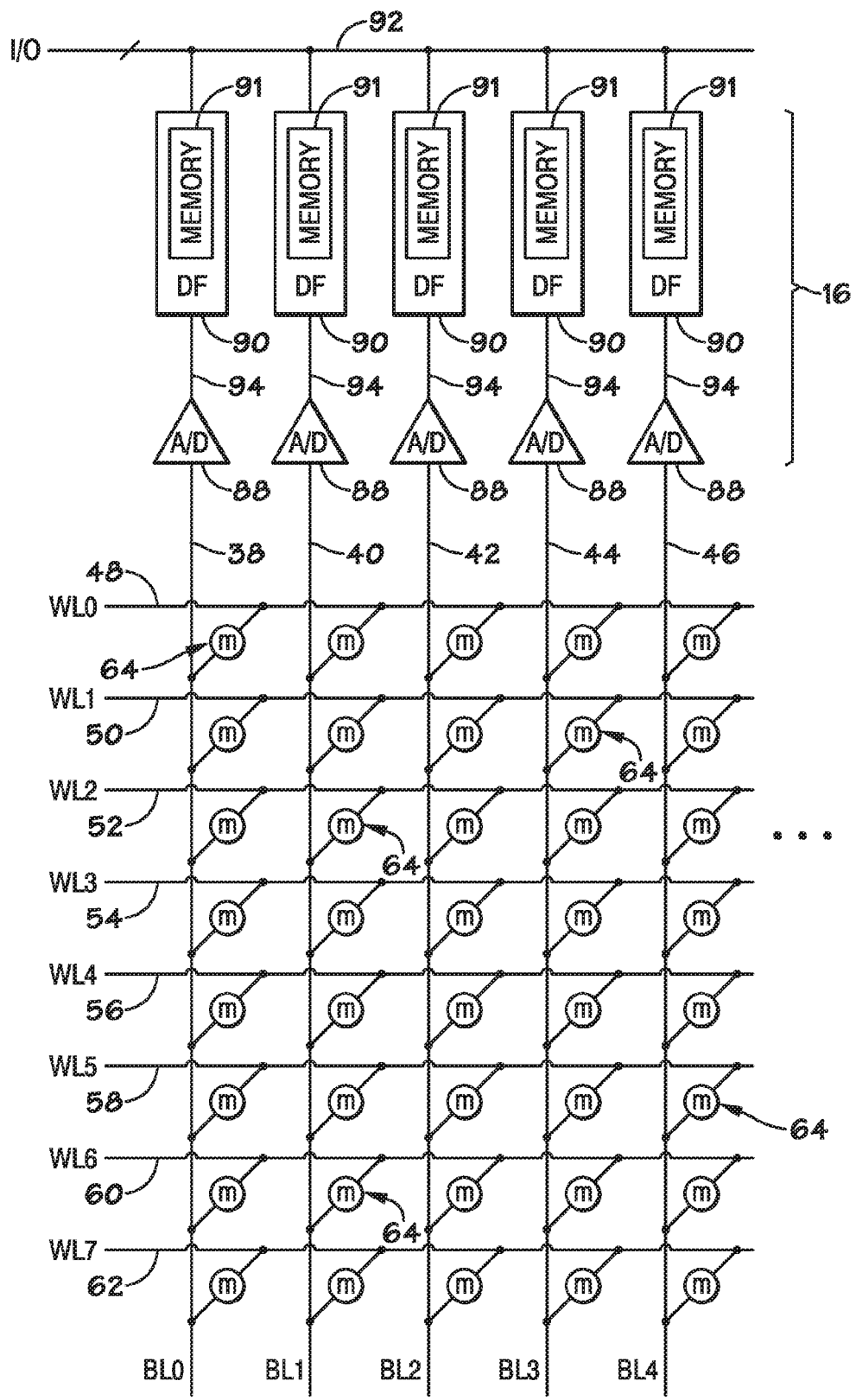
FIG. 7 illustrates a quantizing circuit in accordance with an embodiment of the present invention.

FIG. 7 depicts a quantizing circuit 16 that may tend to reduce the likelihood of an erroneous reading. The illustrated quantizing circuit 16 includes an analog-to-digital converter 88 and a digital filter 90 coupled to each of the bit-lines 38, 40, 42, 44, and 46, respectively. That is, each bit-line 38, 40, 42, 44, and 46 may connect to a different analog-to-digital converter 88 and digital filter 90. The digital filters 90, in turn, may connect to an input/output bus 92, which may connect to a column decoder 18, a column address latch 20, and/or control circuitry 28 (see FIG. 2). In the illustrated embodiment, each of the digital filters 90 includes memory 91 that, as explained below, may locally store values to be written to the memory elements 64.

In operation, the quantizing circuit 16 may digitize analog signals from the memory elements 64 in a manner that is relatively robust to noise. As explained below, the quantizing circuit 16 may do this by converting the analog signals into a bit-stream and digitally filtering high-frequency components from the bit-stream.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{BIT}$ or a bit-line voltage $V_{BL}$, and outputs a bit-stream that corresponds with the analog signal. The bit-stream may be a one-bit, serial signal with a time-averaged value that generally represents or corresponds to the time-averaged value of the analog signal from the memory element 64. That is, the bit-stream may fluctuate between values of zero and one, but its average value, over a sufficiently large period of time, may be proportional to the average value of the analog signal from the memory element 64. In certain embodiments, the bit-stream from the analog-to-digital converter 88 may be a pulse-density modulated (PDM) version of the analog signal. The analog-to-digital converter 88 may transmit the bit-stream to the digital filter 90 on a bit-stream signal path 94.

The digital filter 90 may remove high-frequency noise from the bit-stream. To this end, the digital filter 90 may be a low-pass filter, such as a counter, configured to average or integrate the bit-stream over a sensing time, i.e., the time period over which the memory element 64 is read. As a result, the digital filter 90 may output a value that is representative of both the average value of the bit-stream and the average value of the analog signal from the memory element 64. In some embodiments, the digital filter 90 is a counter, and the cut-off frequency of the digital filter 90 may be selected by adjusting the duration of the sensing time. In the present embodiment, increasing the sensing time will lower the cutoff frequency. That is, the frequency response of the digital filter 90 may be tuned by adjusting the period of time over which the bit-stream is integrated and/or averaged before outputting a final value. The frequency response of the digital filter 90 is described further below with reference to FIG. 15. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different data values may be made smaller, and the number of data values stored by a given memory element 64 may be increased. Thus, beneficially, the quantizing circuit 16 may sense memory elements 64 that store several bits of data, e.g., 2, 3, 4, 5, 6, 7, 8, or more bits per memory element 64.

Although the quantizing circuit 16 may sample the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
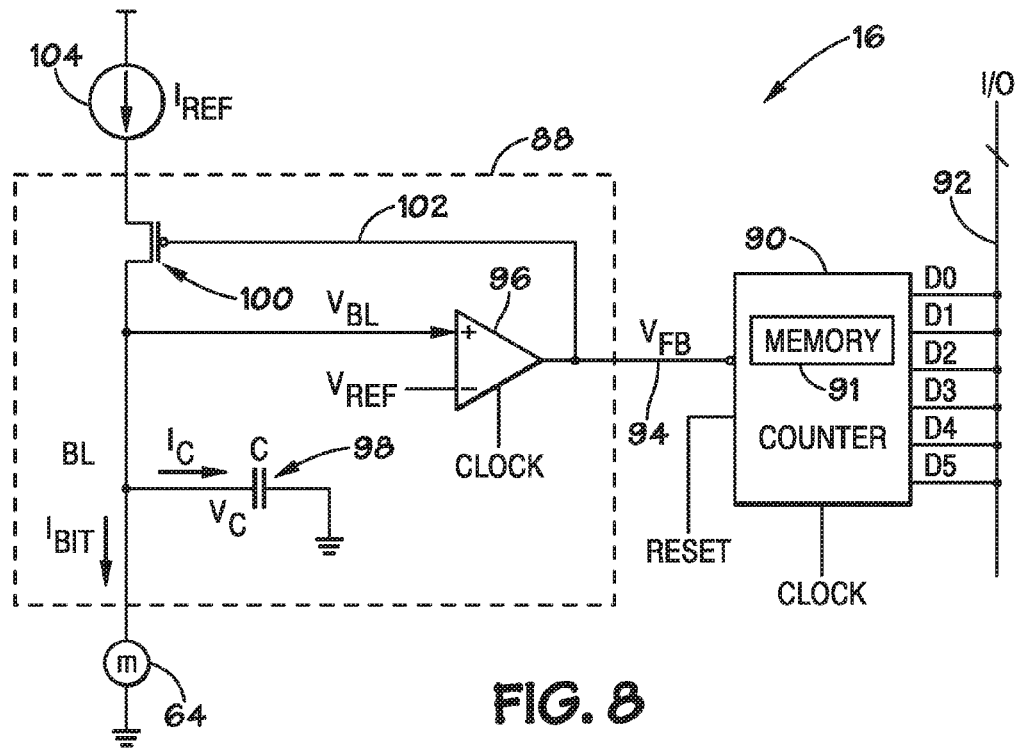
FIG. 8 illustrates a delta-sigma sensing circuit in accordance with an embodiment of the present invention.

FIG. 8 illustrates details of one implementation of the quantizing circuit 16. In this embodiment, the digital filter 90 is a counter with memory 91, and the analog-to-digital converter 88 is a first-order delta-sigma modulator. The illustrated delta-sigma modulator 88 may include a latched comparator 96 (hereinafter the "comparator"), a capacitor 98, and a switch 100. In other embodiments, other types of digital filters and analog-to-digital converters may be employed.

As illustrated, an input of the counter 90 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{Ref}$). One plate of the capacitor 98 may connect to one of the bit-lines 38, 40, 42, 44, or 46, and the other plate of the capacitor 98 may connect to ground.

The illustrated counter 90 counts the number of clock cycles that the bit-stream 94 is at a logic high value or logic low value during the sampling period. The counter may count up or count down, depending on the embodiment. In some embodiments, the counter 90 may do both, counting up one for each clock cycle that the bit-stream has a logic high value and down one for each clock cycle that the bit-stream has a logic low value. Output terminals (D0-D5) of the counter 90 may connect to the input/output bus 92 for transmitting the count. The counter 90 may be configured to be reset to zero or some other value when a reset signal is asserted. In some embodiments, the counter 90 may be a series connection of D-flip flop, e.g., a D-flip flop having SRAM or other memory for storing an initial value and/or values to be written to the memory element 64.

In the illustrated embodiment, the clocked comparator 96 compares a reference voltage ($V_{Ref}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{Ref}$, then the comparator 96 may latch its output to a logic low value, as described below in reference to FIG. 9. Conversely, if $V_{BL}$ is greater than $V_{Ref}$, then the comparator 96 may latch a logic high value on its output, as described below in reference to FIG. 10. As a result, the illustrated comparator 96 outputs a bit-stream that indicates whether $V_{BL}$ is larger than $V_{Ref}$, where the indication is updated once per clock cycle.

Advantageously, in some embodiments, the quantizing circuit 16 may include a single comparator (e.g., not more than one) for each column of multi-level memory elements 64. In contrast, conventional sensing circuits often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
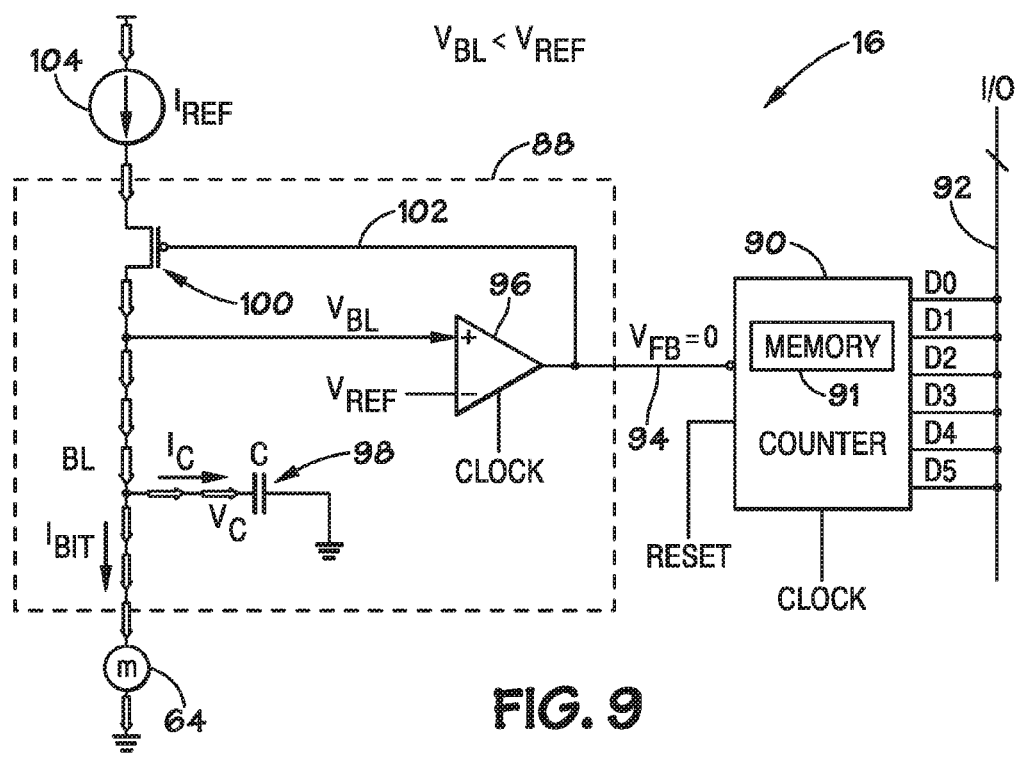
FIGS. 9 and 10 illustrate current flow during operation of the quantizing circuit of FIG. 8.
Figure 10:
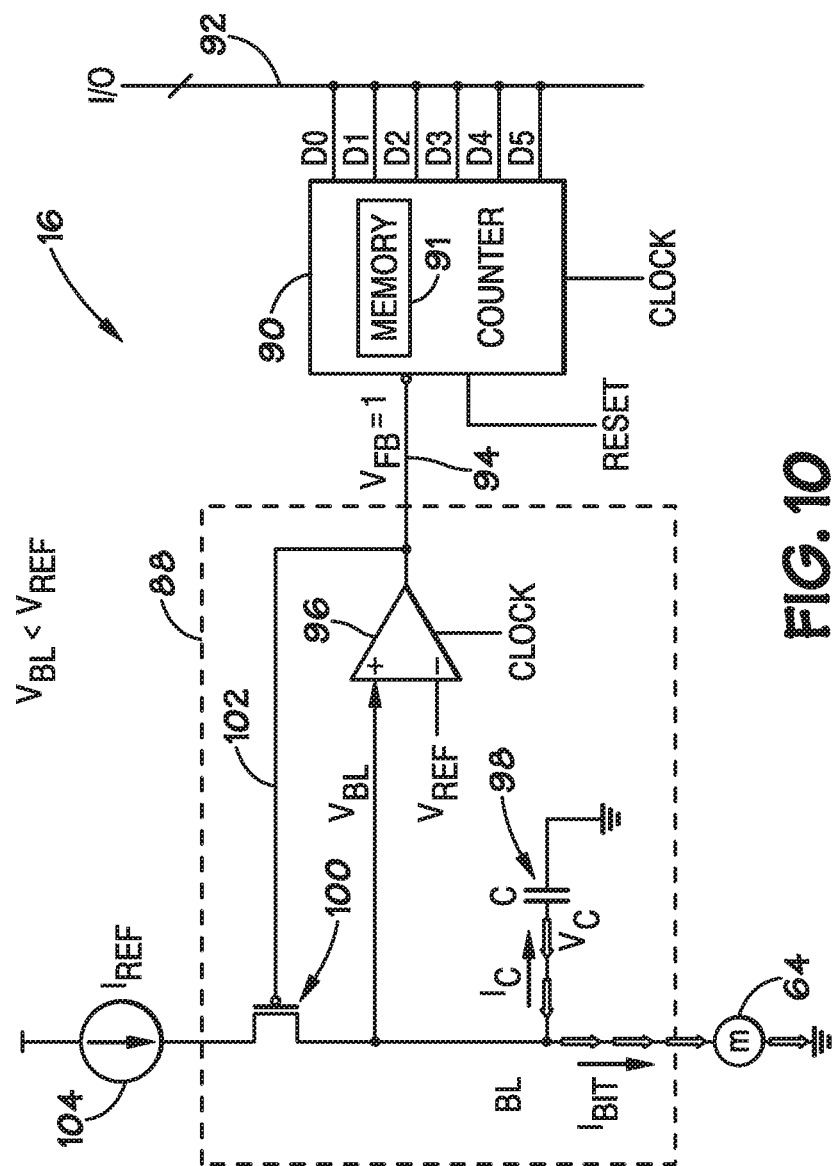
Figure 17:
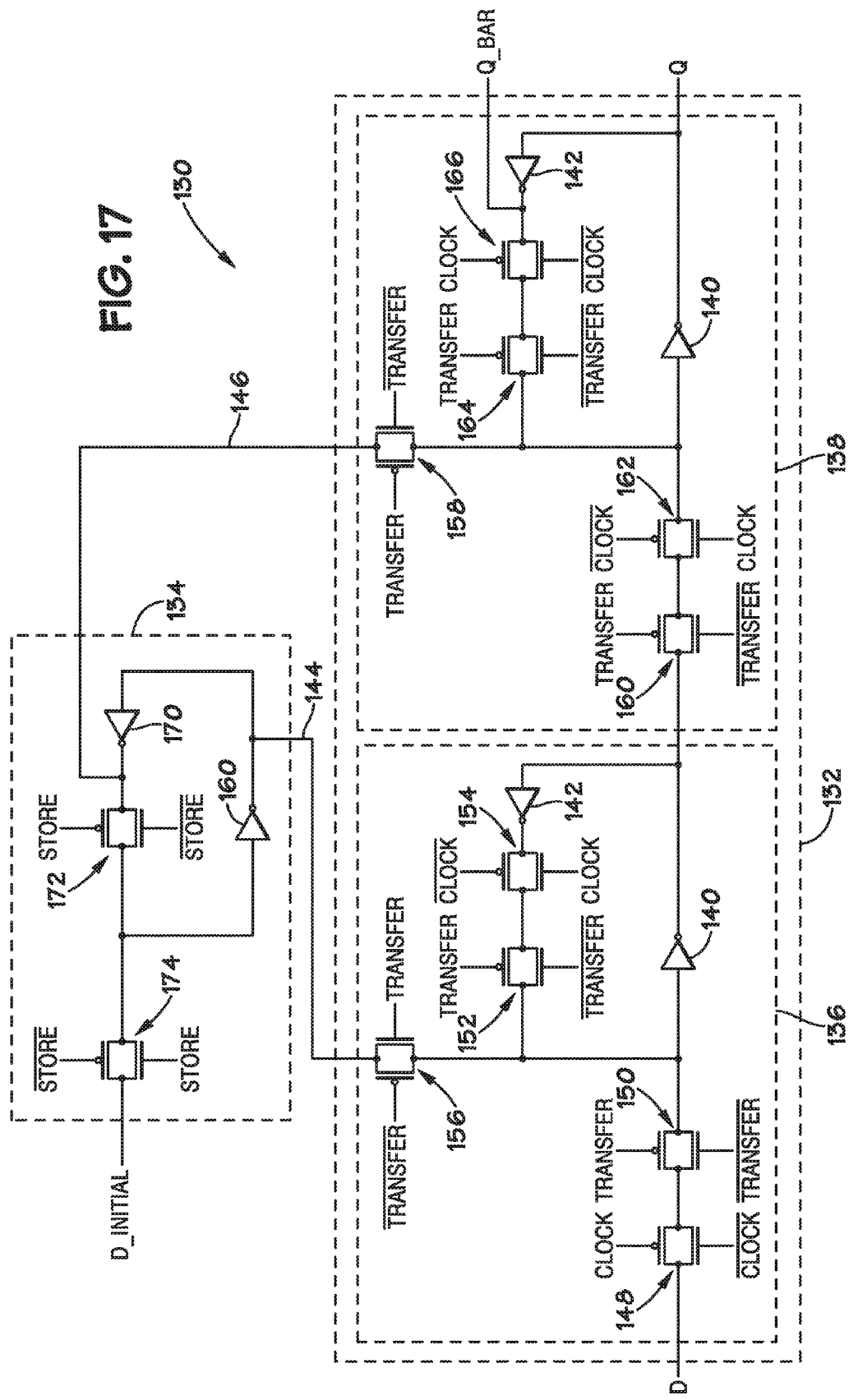
FIG. 17 is an example of a flip-flop that may be employed by the counter of FIG. 16, in accordance with an embodiment of the present invention.

The illustrated switch 100 selectively transmits current $I_{Ref}$ from the reference current source 104. In various embodiments, the switch 100 may be a PMOS transistor (as illustrated in FIGS. 8-10) or an NMOS transistor (as illustrated in FIG. 17) controlled by the $V_{FB}$ signal on the feedback signal path 102.

Figure 11:
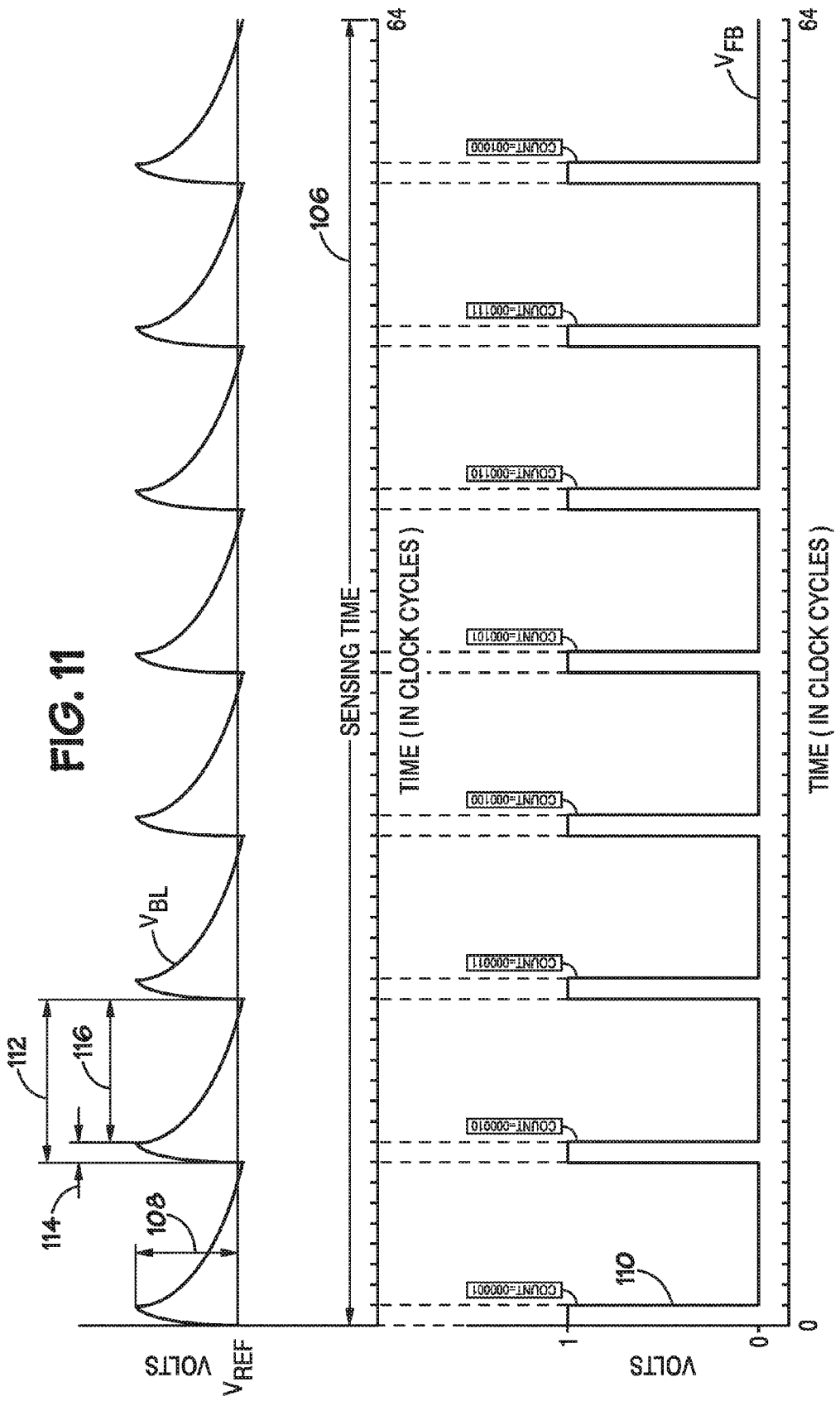
Figure 13:
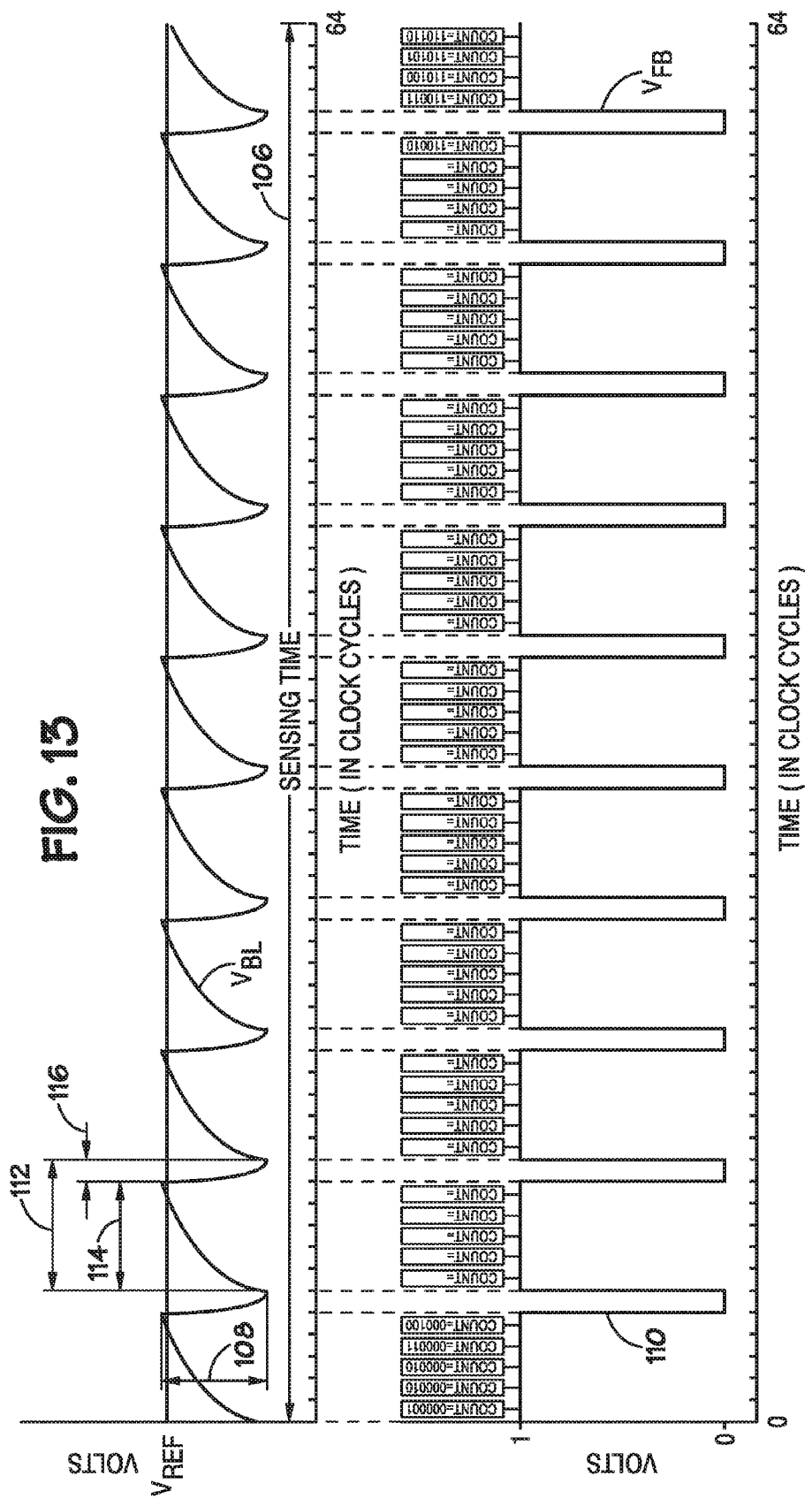

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count of the counter 90 for a relatively small bit-line current. FIG. 12 depicts the same voltages when measuring a medium sized bit-line current, and FIG. 13 depicts these voltages when measuring a relatively large bit-line current.

To measure the current through the memory element 64, the illustrated delta-sigma modulator 88 exploits transient effects to generate a bit-stream representative of the bit-line current $I_{BIT}$. Specifically, the delta-sigma modulator 88 may repeatedly charge and discharge the capacitor 98 with a current divider that subtracts the bit-line current $I_{BIT}$ from the reference current $I_{REF}$. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state"). Each time the delta-sigma modulator 88 changes between these states, the bit-stream changes from a logic high value to a logic low value or vice versa. The proportion of time that the delta-sigma modulator 88 is in the state illustrated by either FIG. 9 or FIG. 10 may be proportional to the size of the bit-line current $I_{BIT}$ through the memory element 64. The larger the bit-line current $I_{BIT}$, the more time that the delta-sigma modulator 88 is in the state illustrated by FIG. 9, rather than the state illustrated by FIG. 10, and the more time that the bit-stream has a logic low value.

Starting with the charging state (FIG. 9), the capacitor 98 may initially accumulate a charge. To this end, the output of the comparator 96 is latched to logic low, which, as mentioned above, may occur when $V_{BL}$ is less than $V_{Ref}$. The logic low may be conveyed to switch 100 by the feedback signal path 102, and the switch 100 may close, thereby conducting the reference current $I_{Ref}$ through one of the bit-lines 38, 40, 42, 44, or 46, as indicated by the larger arrows in FIG. 9. A portion of the electrons flowing through the reference current source 104 may be stored by the capacitor 98, as indicated by the smaller-horizontal arrows, and the remainder may be conducted through the memory element 64, i.e., the bit-line current $I_{Bit}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 enters the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{Ref}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{Ref}$. Once per clock cycle (or at some other appropriate interval, such as twice per clock cycle), the comparator 96 may compare the voltage of the capacitor $V_{BL}$ to the reference voltage $V_{Ref}$. If the capacitor 98 has been charged to the point that $V_{BL}$ is greater than $V_{Ref}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease flowing current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{Ref}$. If $V_{BL}$ is still greater than $V_{Ref}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{Ref}$, then the comparator 96 may output a logic low signal, i.e., $V_{FB}=0$, and the switch 100 may close, thereby transitioning the delta-sigma modulator 88 back to the charging state and initiating a new cycle.

The counter 90 may count the number of clock cycles that the delta-sigma modulator 88 is in either the charging state or the discharging state by monitoring the bit-stream signal path 94. The bit-stream signal path 94 may transition back and forth between logic high and logic low with the output of the comparator 96, $V_{FB}$, and the counter 90 may increment and/or decrement a count once per clock cycle (or other appropriate interval) based on whether the bit-stream is logic high or logic low. After the sensing time has passed, the counter 90 may output a signal indicative of the count on output terminals D0-D5. As explained below, the count may correspond, e.g., proportionally, to the bit-line current, $I_{Bit}$. In some embodiments, the counter 90 may be preset with a value stored in memory 91 such that a relatively simple circuit can determine whether the memory element 64 stores a target value, as explained below.

FIGS. 11-13 illustrate voltages $V_{FB}$ and $V_{BL}$ in the quantizing circuit 16 when reading a memory element 64. Specifically, FIG. 11 illustrates a low-current case, in which the value stored by the memory element 64 corresponds to a relatively low bit-line current. Similarly, FIG. 12 illustrates a medium-current case, and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $V_{BL}$. The abscissa in each of the traces represents time, with the lower trace synchronized with the upper trace, and the duration of the time axes is one sensing time 106.

As illustrated by FIG. 11, the counter 90 is initially set to zero (or some other appropriate value, as described below with reference to FIGS. 15-23) by asserting a reset signal. In some embodiments, the delta-sigma modulator 88 may undergo a number of start-up cycles to reach steady-state operation before initiating the sensing time and resetting the counter 90. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 90 increments the count by one to account for one clock cycle of the bit-stream signal 94 holding a logic low value. Next, the charge stored on the capacitor 98 drains out through the memory element 64, and the bit-line voltage drops until the comparator 96 detects that $V_{BL}$ is less than $V_{Ref}$, at which point the cycle repeats. The cycle has a period 112, which may be divided into a charging portion 114 and a discharging portion 116. Once during each cycle in the sensing time 106, the count stored in the counter 90 may increase by one. At the end of the sensing time 106, the counter 90 may output the total count.

A comparison of FIG. 11 to FIGS. 12 and 13 illustrates why the count correlates with the bit-line current. In FIG. 13, the high-current case, the stored charge drains from the capacitor 98 quickly, relative to the other cases, because the bit-line current $I_{BIT}$ is large and, as a result, the delta-sigma modulator 88 spends more time in the charging state than the discharging state. As a result, the bit-stream has a logic low value for a large portion of the sensing time 106, thereby increasing the count.

The capacitance of the capacitor 98 may be selected with both the clock frequency and the range of expected bit-line currents in mind. For example, the capacitor 98 may be large enough that the capacitor 98 does not fully discharge or saturate when the bit-line current $I_{BIT}$ is either at its lowest expected value or at its highest expected value. That is, in some embodiments, the capacitor 98 generally remains in a transient state while reading the memory element 64. Similarly, the frequency at which the comparator 96 is clocked may affect the design of the capacitor 98. A relatively high frequency clock signal may leave the capacitor 98 with relatively little time to discharge or saturate between clock cycles, thereby leading a designer to choose a smaller capacitor 98.

Similarly, the size of the reference current may be selected with the range of expected bit-line currents in mind. Specifically, in certain embodiments, the reference current is less than the largest expected bit-line current $I_{BIT}$, so that, in the case of maximum bit-line current $I_{BIT}$, the capacitor 98 can draw charge from the reference current while the rest of the reference current flows through the memory element 64.

Figure 14:
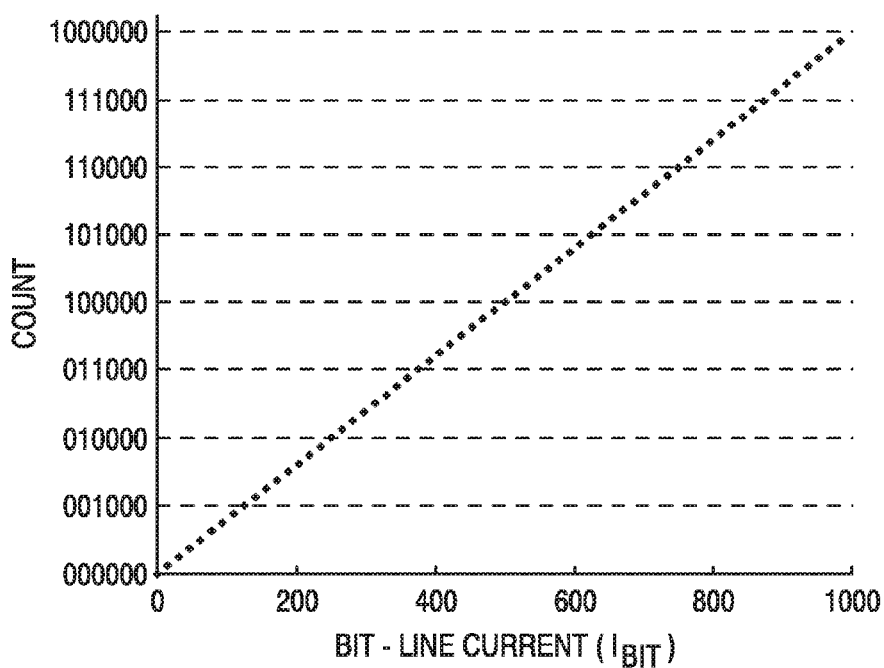
FIG. 14 is a graph of bit-line current versus counter output for the quantizing circuit of FIG. 8.

FIG. 14 illustrates the relationship between the bit-line current $I_{BIT}$ and the count for the presently discussed embodiment. As illustrated by FIG. 14, the count is generally proportional to the bit-line current $I_{BIT}$. This relationship is described by the following equation (Equation 1), in which $N_{ST}$ represents the number of clock cycles during the sensing time:

$$I_{BIT}/I_{Ref}=\text{Count}/N_{ST}$$

Thus, in the illustrated embodiment, the count is indicative of the bit-line current $I_{BIT}$, which is indicative of the value stored by the memory element 64.

Advantageously, the quantizing circuit 16 may categorize the bit-line current $I_{BIT}$ as falling into one of a large number of categories, each of which is represented by an increment of the count. That is, the quantizing circuit 16 may resolve small differences in the bit-line current $I_{BIT}$. The resolution of the quantizing circuit 16 may be characterized by the following equation (Equation 2), in which $I_{MR}$ represents the smallest resolvable difference in bit-line current $I_{BIT}$, i.e., the resolution of the quantizing circuit 16:

$$I_{MR}=I_{Ref}/N_{ST}$$

Thus, the resolution of the quantizing circuit 16 may be increased by increasing the sensing time or the clock frequency or by decreasing $I_{Ref}$, which may limit the maximum cell current since $I_{MR}$ is less than $I_{Ref}$.

The resolution of the quantizing circuit 16 may facilitate storing multiple bits in the memory element 64 or detecting multiple levels of light intensity in an image sensor element. For example, if the quantizing circuit 16 is configured to categorize the bit-line current $I_{BIT}$ into one of four different levels, then the memory element 64 may store two-bits of data or, if the quantizing circuit 16 is configured to categorize the bit-line current $I_{BIT}$ into one of eight different current levels, then the memory element 64 may store three-bits of data. For the present embodiment, the number of bits stored by the memory element 64 may be characterized by the following equation (Equation 3), in which $N_B$ represents the number of bits stored by a memory element 64 and $I_{Range}$ represents the range of programmable bit-line currents through the memory element 64:

$$N_B=\log(I_{Range}/I_{MR})/\log 2$$

In short, in the present embodiment, greater resolution translates into higher density data storage for a given memory element 64.

Figure 15:
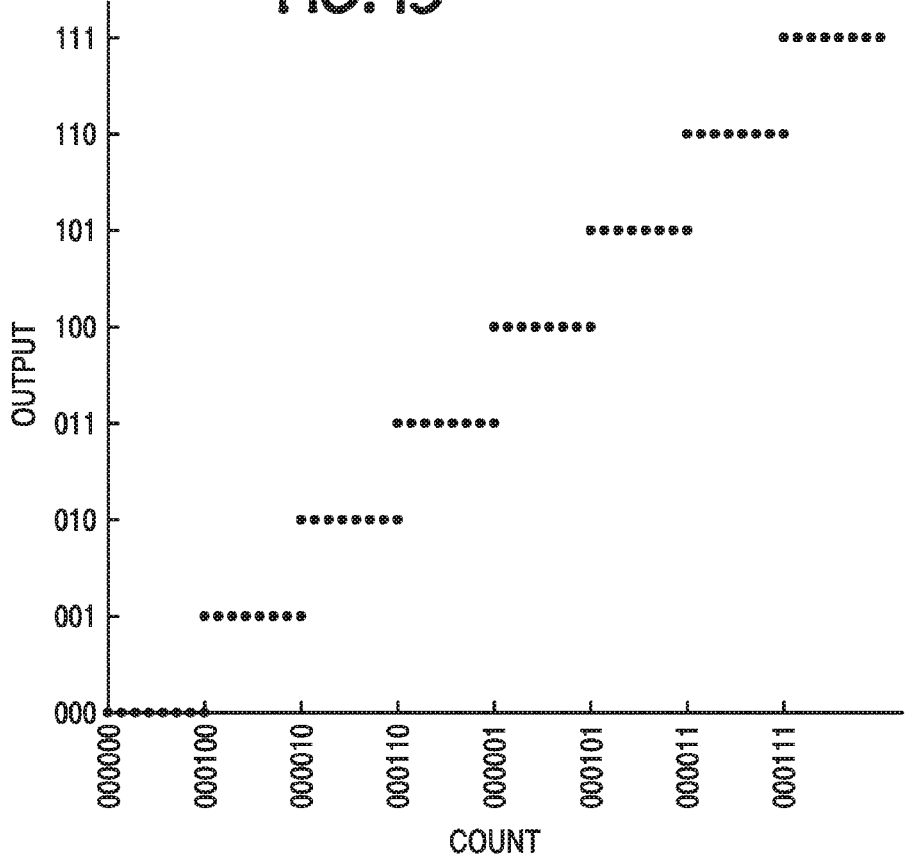
FIG. 15 is a graph of count versus quantizing circuit output in accordance with an embodiment of the present invention.

FIG. 15 is a graph that illustrates one way in which the counter 90 may be configured to further reduce the effects of noise. In FIG. 15, the abscissa represents the count, and the ordinate represents the output of the quantizing circuit 16. In the present embodiment, the three-least-significant digits of the count are disregarded as potentially corrupted by noise. That is, D0-D2 (FIG. 8) either do not connect to the input/output bus 92 or are not interpreted as conveying data that is stored by the memory element 64. As a result, a range of counter values may represent a single data value stored by the memory element 64. For example, in the present embodiment, count values ranging from 00 1000 to 00 1111 are construed as representing a data value of 001. Representing data in this manner may further reduce the effects of noise because, even if noise affects the count, in many embodiments, it would have to affect the count in a consistent manner over a substantial portion of the sensing time to affect the more significant digits of the count. That is, disregarding less significant digits may lower the cutoff frequency of the counter 90. In other embodiments, fewer, more, or no digits may be truncated from the count as potentially representing noise.

Truncating less significant digits may introduce a rounding error, or a downward bias, in the output. This effect may be mitigated by presetting the counter 90 in a manner that accounts for this bias. The counter 90 may be present either before reading from the memory element 64 or before writing to the memory element 64. In some embodiments, the preset value may be one-half of the size of the range of counter values that represent a single output value. In other words, if m digits are truncated from the output, then the counter 90 may be preset to one-half of $2^m$ before reading from a memory element 64 or before writing to the memory element 64. In some embodiments, the memory 91 may store this preset value, as described below with reference to FIGS. 16-23.

Figure 16:
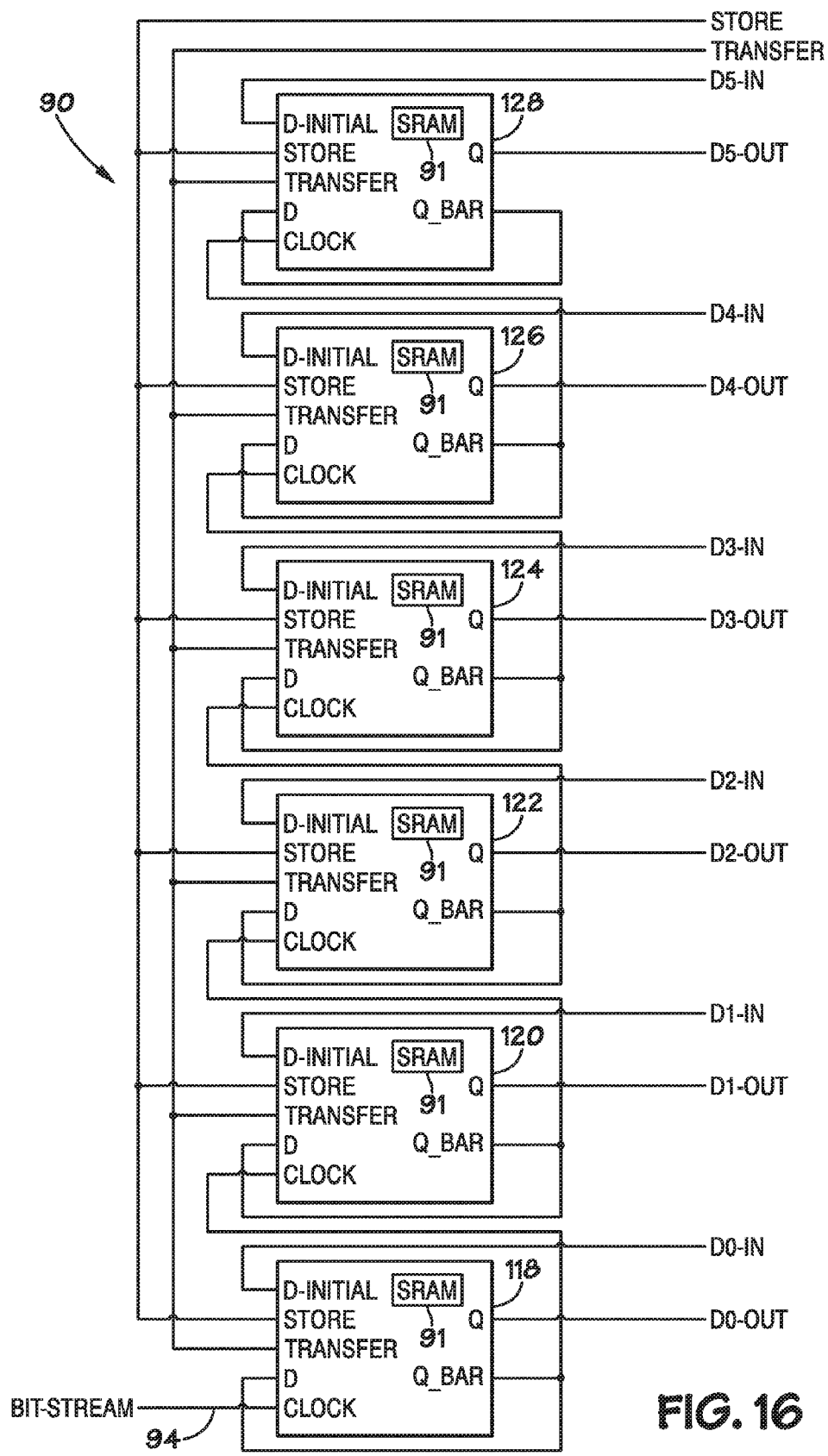
FIG. 16 is an example of a counter in accordance with an embodiment of the present invention.

FIG. 16 illustrates an example of a counter 90 that may be employed in the quantizing circuit 16. The illustrated counter 90 includes six-cascaded flip-flops 118-128. Each of the illustrated flip-flops 118-128 includes memory 91, which may include static random access memory (SRAM), dynamic access random access memory (DRAM), or other appropriate types of memory. Each of the illustrated flip-flops 118-128 includes an output labeled Q that represents one digit of the count, with flip-flop 118 representing the least significant bit and flip-flop 128 representing the most significant bit. In each illustrated flip-flop 118-128, a Q_bar output, which is an inverted version of the Q output, is coupled to an input labeled D and a clock input of the flip-flop representing the next highest digit, except the clock input of the flip-flop 118, which is coupled to the bit-stream 94.

Each illustrated flip-flop 118-128 also includes a store, transfer, and D-initial input. These inputs may be asserted to locally store a target value to be written to a memory element 64 and to preset the counter 90. Asserting the store signal may cause the flip-flops 118-128 to store the signal on the D-initial input in memory 91. In the illustrated embodiment, the D-initial and Q signals are on different signal paths. However, in other embodiments, the signals may share a signal path. Asserting a transfer signal may cause each flip-flop 118-128 to preset itself, such that its output Q corresponds to the value stored in memory 91.

FIG. 17 illustrates an example of a flip-flop 130, which may embody the flip-flops 118-128 illustrated in FIG. 16. The illustrated flip-flop 130 includes a D-flip-flop 132 and SRAM 134. The D-flip-flop 132 may include a master flip-flop 136 and a slave flip-flop 138. These flip-flops 136 and 138 may be edge-triggered flip-flops, e.g., rising-edge triggered or falling-edge triggered. Both the master flip-flop 136 and the slave flip-flop 138 include inverters 140 and 142 with the input of each inverter connected to the output of the other inverter in the same flip-flop 136 or 138. In the slave flip-flop 138, the Q output is connected between these inverters 140 and 142, and the Q_bar output is connected to the output of the inverter 142. In the master flip-flop 136, the D input is coupled to the input of the inverter 140. Additionally, the input of the inverter 140 in the master flip-flop 136 may be coupled to a first output 144 of the SRAM 134, and the input of the inverter 140 in the slave flip-flop 138 may be coupled to a second output 146 of the SRAM 134, where the second output 146 is an inverted version of the first output 144.

The D-flip-flop 132 also includes a plurality of transmission gates 148, 150, 152, 154, 156, 158, 160, 162, 164, 166. Each illustrated transmission gate 148-166 includes a PMOS and an NMOS transistor with inverted control signals, e.g., clock and $\overline{clock}$. The NMOS gate may pass a stronger logic low signal than a PMOS gate, and the PMOS gate may pass a stronger logic high signal than an NMOS gate. As a result, the transmission gate arrangement illustrated by FIG. 17 may transmit relatively clean, rail-to-rail signals through the transmission gates 148-166, regardless of the content of the signals.

These transmission gates 148-166 may be controlled by the clock signal and the transfer signal, as indicated by FIG. 17. In operation, the transmission gates 148-146 may improve the noise performance of the D-flip-flop 132 by preventing the signals connected to the input of the inverter 140 from counteracting each other. That is, the transmission gates 148-166 may close (i.e., connect, such that current may flow) a signal path to the input of the inverter 140 for either the D input, the signal from the SRAM 144 or 146, or the feedback signal from the inverter 142. As a result, the D-flip-flop 132 may respond faster than a D-flip-flop without transmission gates because the transmission gates isolate the potential inputs to the inverters 140, thereby expediting a change in state of the input of the inverters 140.

In operation, the D-flip-flop 132 may transfer data according to the clock signal. For example, on the rising edge of the clock signal, the master flip-flop 136 may transfer the value of the output of the inverter 142 the slave flip-flop 138 and capture the value of the D-input.

The SRAM 134 may include inverters 168 and 170 and transmission gates 172 and 174. In the present embodiment, the output of the inverter 168 is connected to the input of the inverter 170, and the input of the inverter 168 is connected to the output of the inverter 170 via the transmission gate 172. The D-initial input may be connected to the input of the inverter 168 via the transmission gate 174. The transmission gates 172 and 174 may be controlled by the store signal, with a logic high store signal opening transmission gate 174 and closing transmission gate 172 and vice versa.

The illustrated flip-flop 130 may be characterized as storing three bits of data. In this embodiment, the SRAM 134 stores one bit of data, the state of the master flip-flop 136 stores a second bit of data, and the state of the slave flip-flop 138 stores a third bit of data. In other words, the illustrated flip-flop 130 has three-degrees of freedom, meaning that its state can be described with three variables. In other embodiments, flip-flop 130 may store more or less data. However, the master flip-flop 136 and slave flip-flop 138 are distinct from the SRAM in that they are controlled, at least in part, by the clock signal.

Figure 18:
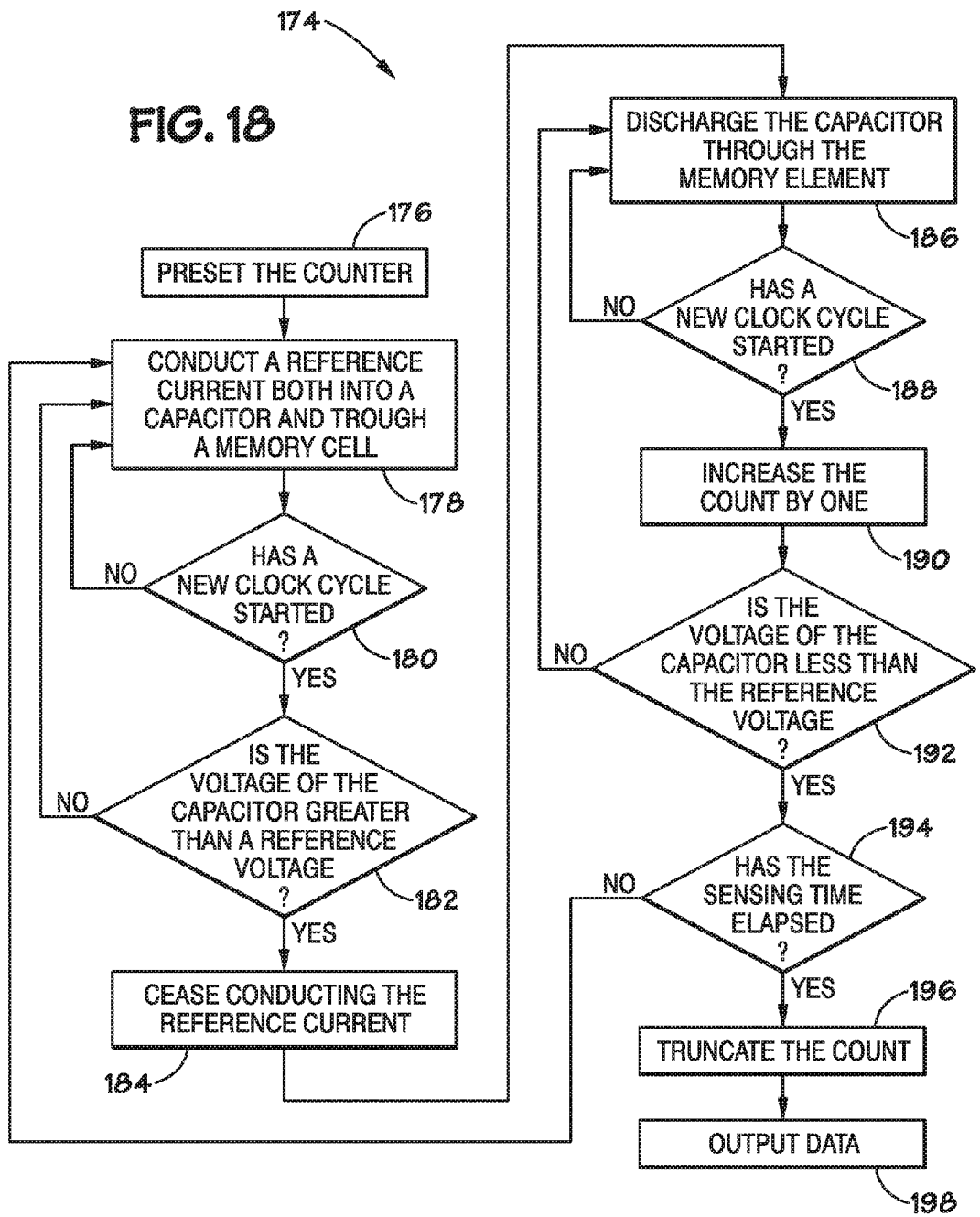
FIG. 18 is a flow chart of an example of a read operation in accordance with an embodiment of the present invention.

FIG. 18 depicts an example of a read operation 174 that is performed by certain embodiments of the quantizing circuit 16. The read operation 174 begins with presetting the counter, as illustrated by block 176. In the present embodiment, the counter is preset to one-half of $2^m$, where m is the number of digits dropped from the count, to average-out the effect of rounding down when truncating digits from the count. Alternatively, the counter may be set to zero or some other value.

In some embodiments, presetting includes storing and transferring the preset value. For example, in some embodiments employing the counter 90 illustrated by FIG. 16, presetting includes asserting the value to be transferred on D0-in through D5-in and asserting a store signal. In these embodiments, after storing the preset value, the preset value is transferred to the D-flip-flops 132 (FIG. 17) by asserting the transfer signal.

Next, the reference current is conducted both into the capacitor (e.g., the capacitor 98 illustrated in FIG. 8) and through the memory cell, as illustrated by block 178. Then, a determination is made as to whether a new clock cycle has started, as depicted by block 180. Depending on the result, the read operation 174 either returns to block 178 or continues to block 182, where a determination is made as to whether the voltage of the capacitor is greater than a reference voltage. Depending on the result, the read operation 174 either returns to block 178 or continues to block 184, at which point the reference current is no longer conducted.

Next, the capacitor is discharged through the memory element, as depicted by block 186, and a determination is made as to whether a new clock cycle has started, as depicted by block 188. Based on the results of the determination, either the capacitor continues to discharge through the memory cell, as described by block 186, or the count is increased by one, as depicted by block 190. In some embodiments, the counter may count down rather than up, and the count may be decreased by one rather than increased by one.

After changing the count, a determination is made as to whether the voltage of the capacitor is less than the reference voltage, as depicted by block 192. Based on the result of the determination, the read operation 174 either returns to block 186 to continue discharging the capacitor or continues to block 194, where a determination is made as to whether the sensing time has elapsed. Based on the determination at block 194, the read operation 174 either returns to block 178 to initiate a new charge and discharge cycle or outputs a data value from the counter, as depicted by block 196.

The counter may then truncate the count by m-least-significant digits, as illustrated by block 196. Next, the truncated value is output as the data value stored by the memory element, as illustrated by block 198. Outputting the data may include storing the data in tangible, machine-readable memory; transmitting the data to another component; displaying the data, or using the data in subsequent calculations.

Figure 19:
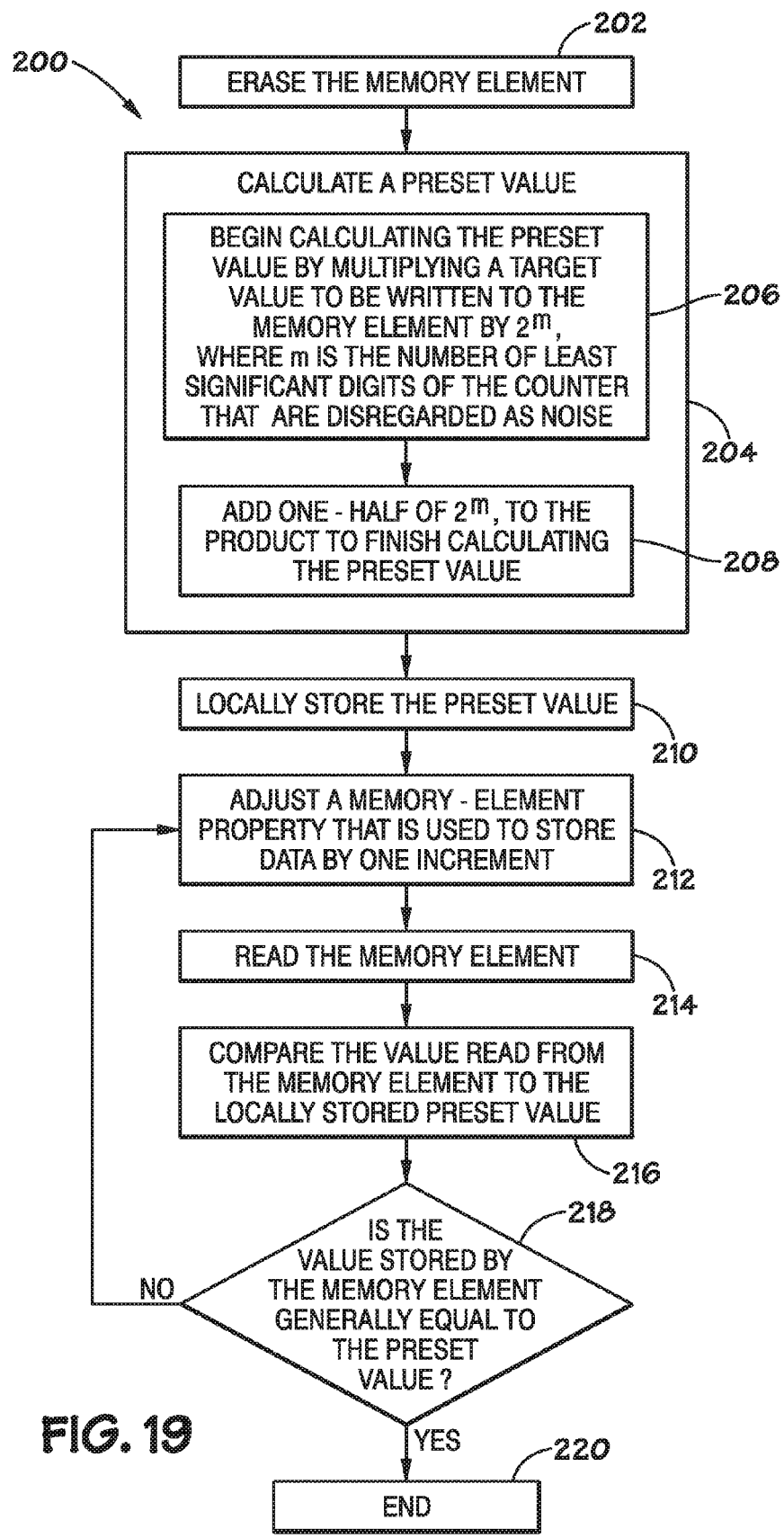
FIG. 19 is a flow chart of an example of a write operation in accordance with an embodiment of the present invention.

FIG. 19 illustrates an example of a write operation 200. The illustrated write operation 200 begins by erasing the memory element, as illustrated by block 202. Erasing the memory element may include erasing an entire row or bank of memory elements generally simultaneously.

Next, in the present embodiment, a preset value is calculated, as illustrated by block 204. Calculating a preset value may include calculating a preset value that accounts for rounding error when truncating bits from the count. In the present embodiment calculating a preset value begins with multiplying a target value to be written to the memory element by $2^m$, where m is the number of least-significant digits of the count that are disregarded as noise, as illustrated by block 206. For example, if the target value is 010 and m=3, then $2^m$ equals 8, and the multiplication act illustrated by block 206 results in a product of 01 0000.

To finish calculating the preset value, in the present embodiment, one half of $2^m$ is added to the product of the multiplication act illustrated by block 206, as illustrated by block 208. For instance, continuing with the previous example, if the product of the act illustrated by block 206 is 01 0000 and three digits are truncated (m=3), then the preset value is equal to 01 0100. In other embodiments, this act may be omitted, which is not to suggest that other acts described herein may not also be omitted.

Next, in the present embodiment, the preset value to be written to the memory element is locally stored, as illustrated by block 210. Locally storing the preset value may include storing the preset value in memory integrated with the counter, as illustrated by FIGS. 16 and 17. In other embodiments, locally storing the value may include storing the preset value in a dedicated memory associated with each column or block of memory elements. As explained below, in some embodiments, a locally stored preset value may be accessed without requesting the preset value from more distant components, such as the column decoder 18, column address latch 20, or control circuitry 28 (FIG. 2), over the input/output bus 92.

After locally storing the preset value, a memory-element property that is used to store data may be adjusted by one increment, as illustrated by block 212. Adjusting a memory-element property may include driving a charge on to a floating gate or partially changing the phase of a phase-change memory element. After adjusting the memory-element property, the memory element is read, as illustrated by block 214. This step may include performing the read operation 174 illustrated in FIG. 18. In some embodiments, the read operation 174 may be performed without the truncation act illustrated by block 196.

After reading the memory element, it is determined whether the value stored by the memory element is generally equal to the preset value to be written to the memory element, as illustrated by block 218. If the value to be written is not generally equal to the value to be stored, then the memory element property may be adjusted by another increment, and the operation 200 may return to block 212. On the other hand, if the value stored by the memory element is generally equal to the preset value, then the write operation 200 may end, as illustrated by block 220. In the various embodiments, the comparison illustrated by block 218 may include determining whether the value stored by the memory element is greater than or equal to the preset value or within some tolerance of the preset value.

Figure 20:
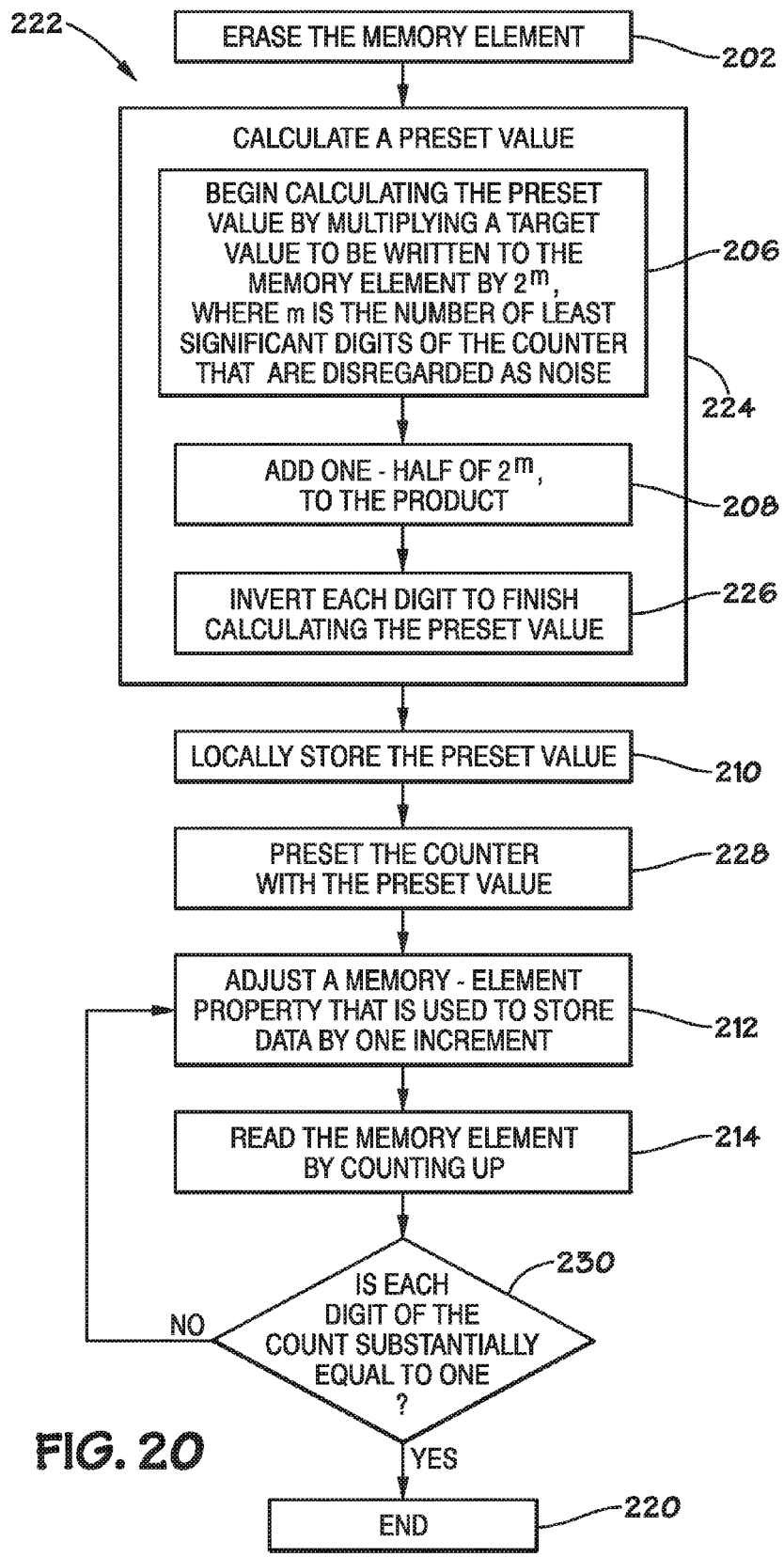
FIG. 20 is a flow chart of a second example of a write operation in accordance with an embodiment of the present invention.

FIG. 20 illustrates a second example of a write operation 222. In this embodiment, the acts that are illustrated with the same reference number as in FIG. 19 are generally similar to those acts that were previously discussed in reference to FIG. 19. In addition to these acts, the illustrated write operation 222, includes a different way of calculating a preset value, as illustrated by block 224. In this embodiment, after accounting for the rounding error in the acts illustrated by blocks 206 and 208, each digit of the resulting sum is inverted to calculate the preset value. For example, if the target value is a four-bit word of 1101, and four-least-significant bits are dropped to attenuate noise (i.e., m=4), then the result of the acts illustrated by block 206 and 208 is 1101 1000, and the inversion act illustrated by block 226 results in a preset value of 0010 0111. In this act, leading zeros should also be inverted, e.g., in an embodiment employing a ten-digit counter, all ten digits should be inverted even if the result of the acts illustrated by block 206 and 208 can be represented by fewer digits.

In the write operation 222, after locally storing the preset value, it is used to preset the counter, as illustrated by block 228. In some embodiments, such as the embodiment illustrated by FIG. 16, presetting the counter may include asserting a transfer signal.

Presetting the counter with this value may simplify the circuitry that performs the comparison illustrated by block 230. In the present embodiment, rather than comparing each digit of the value read from the memory element to the corresponding digit of the target value to determine whether the memory element stores the target value, it is determined whether the count is all ones (e.g., 1111 1111 for an eight-bit counter). Calculating a preset value in the manner illustrated by block 224 may result in a preset value that sums with the target value and the rounding error correction to a value that is represented by the counter with all ones.

The comparison illustrated by block 230 may include determining whether the count is greater than zero or within some tolerance of zero, e.g., within plus or minus half of $2^m$ of zero. If an affirmative determination is made in the comparison illustrated by block 230, then the write operation 222 may end. Otherwise, the write operation 222 may return to the act illustrated by block 228, and the counter may be reset again with the preset value, e.g., by asserting the transfer signal (FIG. 16). Advantageously, because the preset value is locally stored in the present embodiment, presetting the counter may occur relatively quickly compared to embodiments that request the preset value or target value over the input/output bus 92.

Figure 21:
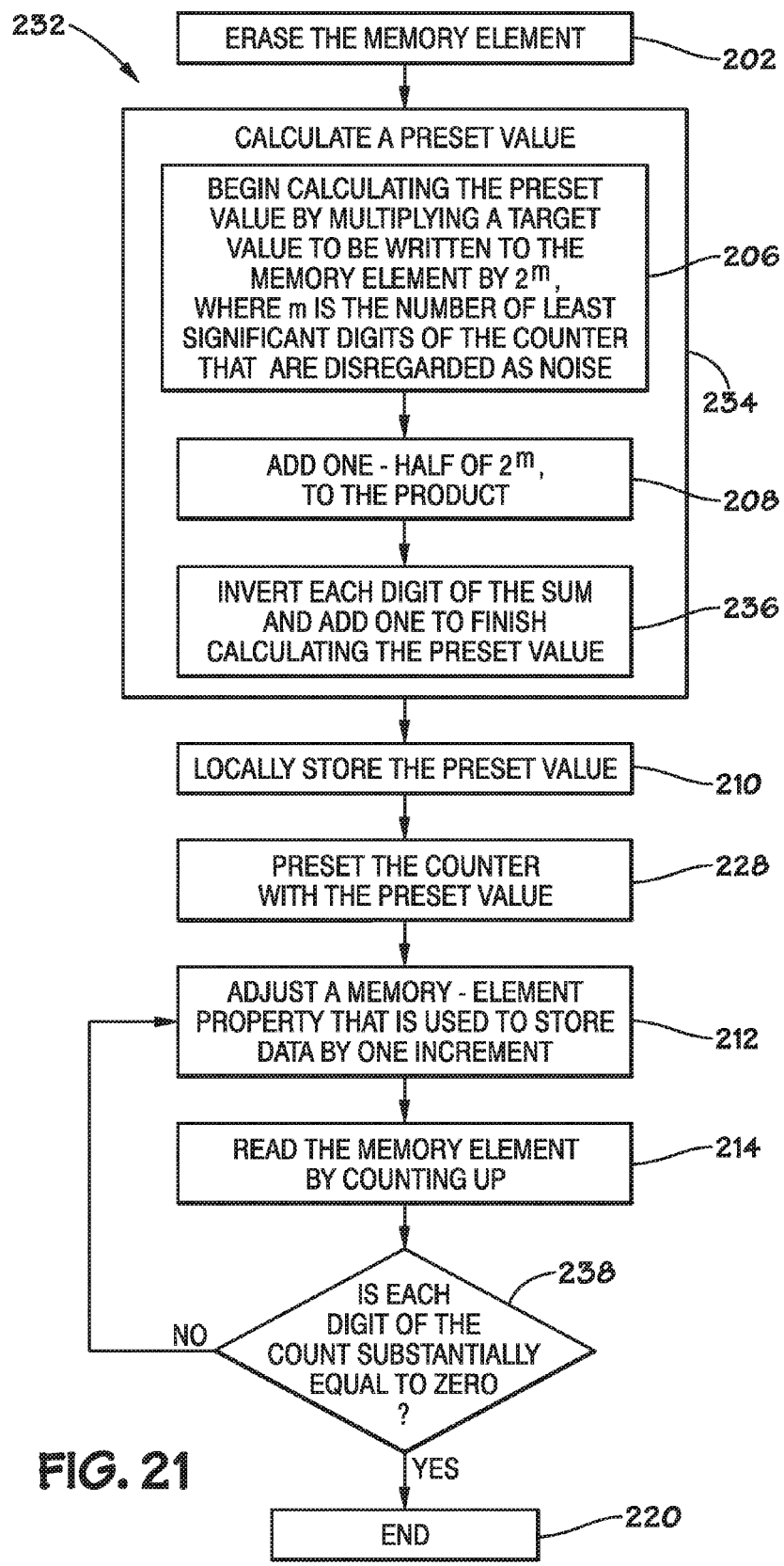
FIG. 21 is a flow chart of a third example of a write operation in accordance with an embodiment of the present invention.

FIG. 21 illustrates another example of a write operation 232. In this embodiment, calculating a preset value, as illustrated by block 234, includes inverting each digit of the count and then adding one, as illustrated by block 236. Later in the operation 232, it is determined whether the memory element stores the correct value by determining whether each digit of the count is substantially equal to zero (e.g., 0000 0000 in an eight-bit counter), as illustrated by block 238.

Figure 22:
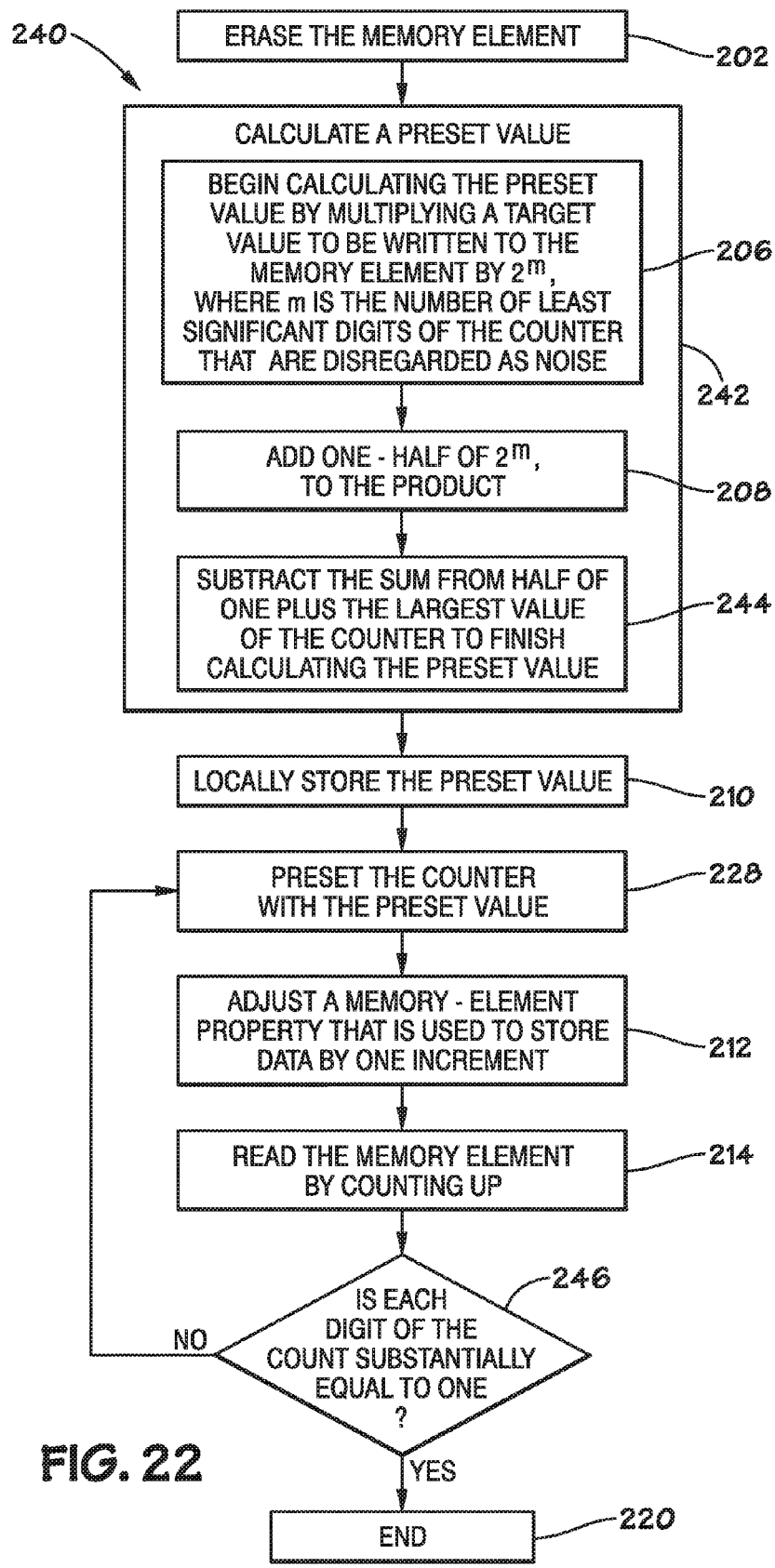
FIG. 22 is a flow chart of a fourth example of a write operation in accordance with an embodiment of the present invention.

FIG. 22 illustrates another example of a write operation 240. In this embodiment, the most-significant digit of the count is reserved for indicating whether the memory element stores the target value. Calculating a preset value, in this embodiment, includes subtracting the sum from half of one plus the largest value of the counter, as illustrated by block 244 in block 242. The largest value of the counter is the value represented by the counter when each of its output terminals (e.g., D0-out to D5-out in the embodiment illustrated by FIG. 16) is logic high. For example, in the six-bit counter 90 of FIG. 16, the largest value of the counter is 11 1111. Adding one to this value results in a value of 100 0000, one half of which is 10 0000. In the present embodiment, this is the value from which the sum is subtracted. For instance, if the sum produced by block 208 is 1 0100, then subtracting this from 10 0000 results in a preset value of 00 1100.

In the illustrated embodiment, the largest digit of the counter indicates whether the memory element stores the target value. Thus, in the comparison illustrated by block 246, it is determined whether the most-significant digit of the counter is substantially equal to one. For example, if the target value is 10, the counter has six digits, and three digits are dropped, then the preset value is 00 1100, and the counter counts up from 00 1100 to 10 0000 when reading from a memory element storing the target value. Thus, in this example, the most-significant digit signals whether the memory element stores the target value. Advantageously, presetting the counter in this manner may simplify or eliminate the circuitry that determines whether the memory element stores the correct value.

Figure 23:
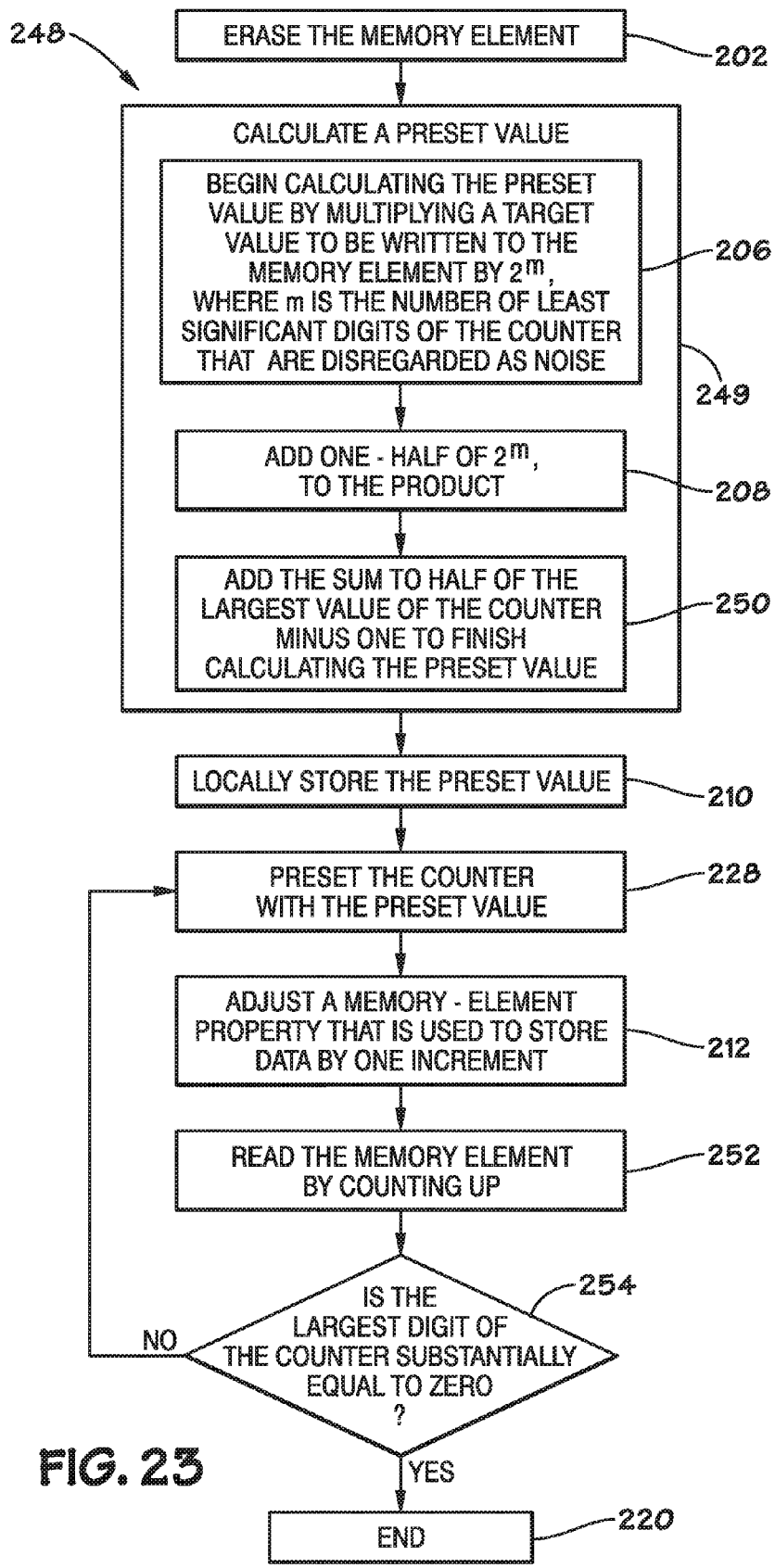
FIG. 23 is a flow chart of a fifth example of a write operation in accordance with an embodiment of the present invention.

FIG. 23 illustrates another example of a write operation 248. In this embodiment, the memory element is read by counting down rather than up. This embodiment is similar to the write operation 240 illustrated by FIG. 22 except the acts illustrated by blocks 250, 252, and 254. In the act illustrated by block 250, which is in block 249, the sum is added to half of the largest value of the counter minus one to calculate the preset value. In the act illustrated by block 252, the memory element is read by counting down rather than up. For example, each clock cycle that the bit-stream has a logic high value, the counter may decrement the count by one. Like the previous embodiment, in this embodiment, the most-significant digit of the count indicates whether the memory element stores the target value. However, in the embodiment, the largest digit indicates this by assuming a value of zero.

Figure 24:
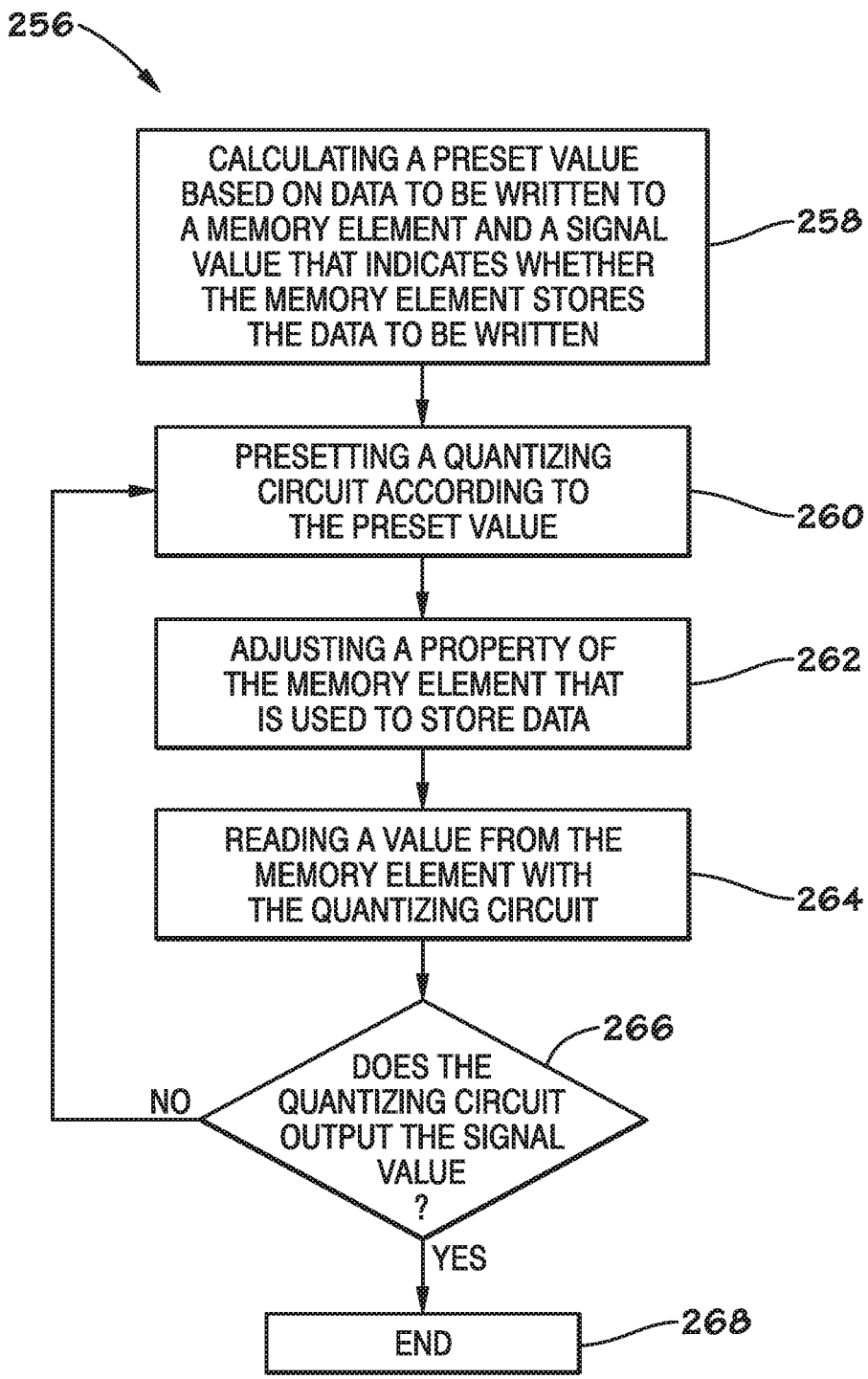
FIG. 24 is a flow chart of a sixth example of a write operation in accordance with an embodiment of the present invention.

FIG. 24 illustrates another example of a write operation 256. The illustrated embodiment begins with calculating a preset value based on both data to be written to a memory element and a signal value that indicates whether the memory element stores the data to be written, as illustrated by block 258. In certain embodiments, the signal value may be both independent of the data being written to the memory element and determined by comparison circuitry of the memory device. In other words, regardless of the value of the data being written, the same signal value indicates that a memory element stores the data being written because the signal value is tailored to the comparison circuitry. For example, in the embodiment of FIG. 20, the signal value occurs when each digit of the count is substantially equal to one. In this embodiment, the comparison circuitry may include an AND-gate with an input for each digit of the count (or each non-truncated digit of the count). Similarly, in the embodiment of FIG. 21, the signal value occurs when each digit of the count is substantially equal to zero, and the comparison circuitry may include an AND-gate with an inverted input for each digit of the count. In the embodiment of FIG. 22, the signal value occurs when the most-significant digit of the counter is substantially equal to one, and, in the embodiment of FIG. 23, the signal value occurs when the most-significant digit of the counter is substantially equal to zero. In these embodiments, the comparison circuitry may be omitted because the most-significant digit of the counter (or its inverse) is generally synonymous with the condition of the memory element storing the proper value. In short, the signal value is determined by the circuit that indicates whether the memory element stores the proper value.

In each of the embodiments illustrated by FIGS. 20-24, the same signal value indicates that the memory element stored the proper value regardless of the value being stored. As a result, in certain embodiments, the circuitry that determines whether the memory element stores the proper value is relatively simple. For instance, in the embodiment of FIGS. 22 and 23, this circuitry can be entirely omitted, which is not to suggest that other components may not also be omitted in other embodiments.

Next in the write operation 256, the quantizing circuit is preset according to the present value, as illustrated by block 260. Presetting may include changing the state of flip-flops in a counter or otherwise configuring a digital filter. In some embodiments, this act may be preceded by an act of locally storing the preset value, for instance in memory in a counter. After presetting the quantizing circuit, a property of the memory element that is used to store data may be adjusted, as illustrated by block 262, and a value may be read from the memory element with the quantizing circuit, as illustrated by block 264. Next, it is determined whether the quantizing circuit outputs the signal value, as illustrated by block 266. If the quantizing circuit does not output the signal value, then the write operation 256 returns to the act illustrated by block 260. Otherwise, the write operation 256 ends, as illustrated by block 268.

Figure 25:
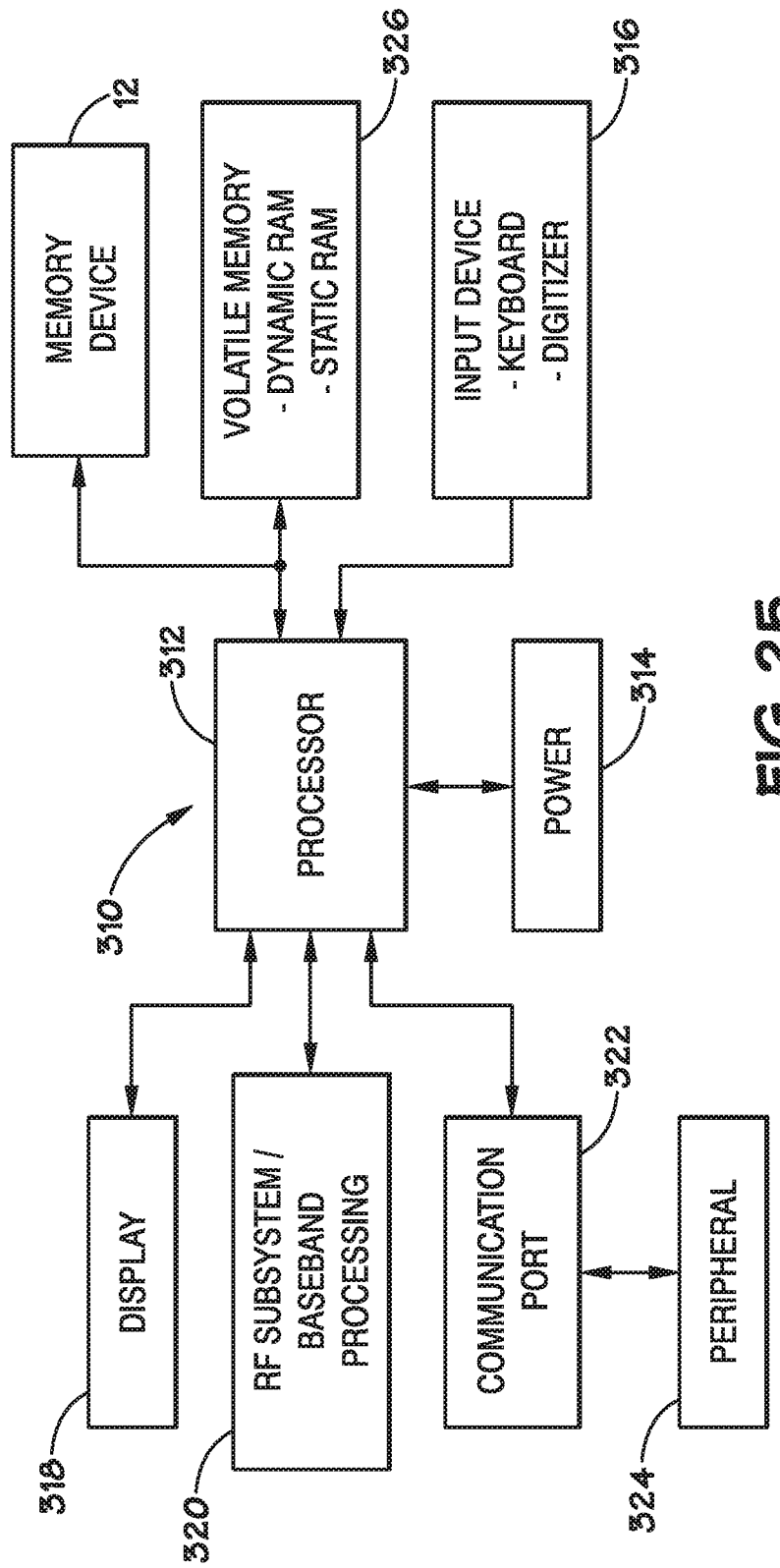
FIG. 25 is an example of a system that includes the memory device of FIG. 2 in accordance with an embodiment of the present invention.

FIG. 25 depicts an exemplary processor-based system 310 that includes the memory device 12. Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be coupled to the processor 312 depending on the functions that the system 310 performs. For instance, a user interface 316 may be coupled to the processor 312. The user interface 316 may include buttons, switches, a keyboard, a light pen, a mouse, a digitizer and stylus, and/or a voice recognition system, for instance. A display 318 may also be coupled to the processor 312. The display 318 may include an LCD, an SED display, a CRT display, a DLP display, a plasma display, an OLED display, LEDs, and/or an audio display, for example. Furthermore, an RF sub-system/baseband processor 320 may also be coupled to the processor 312. The RF sub-system/baseband processor 320 may include an antenna that is coupled to an RF receiver and to an RF transmitter (not shown). One or more communication ports 322 may also be coupled to the processor 312. The communication port 322 may be adapted to be coupled to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably coupled to the processor 312 to store and facilitate execution of various programs. For instance, the processor 312 may be coupled to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be coupled to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data. Additionally, the non-volatile memory 328 may include a high capacity memory such as a tape or disk drive memory.

The memory device 10 and volatile memory 326 may store various types of software, such as an operating system or office productivity suite including a word processing application, a spreadsheet application, an email application, and/or a database application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An electronic device, comprising:
   an internal data storage location coupled to an electrical conductor; and
   a quantizing circuit coupled to the internal data storage location via the electrical conductor, the quantizing circuit comprising:
      an analog-to-digital converter having an input and an output, wherein the input is coupled to the electrical conductor; and
      a digital filter coupled to the output of the analog-to-digital converter, wherein the digital filter comprises memory distinct from filtering circuitry of the digital filter, and wherein the digital filter is configured to store a preset value utilized to initialize the digital filter in the memory.

2. The electronic device of claim 1, wherein the internal data storage location comprises a non-volatile memory element selected from a floating-gate transistor, a phase-change memory element, or a magneto-resistive memory element.

3. The electronic device of claim 1, wherein the analog-to-digital converter comprises a delta-sigma modulator.

4. The electronic device of claim 1, wherein the memory comprises static random access memory (SRAM).

5. The electronic device of claim 1, wherein the digital filter comprises a counter.

6. The electronic device of claim 5, wherein the counter comprises a plurality of D-flip flops connected in series.

7. The electronic device of claim 6, wherein each of the plurality of D-flip flops comprise:
   SRAM;
   a master flip flop coupled to the SRAM; and
   a slave flip flop coupled to both the SRAM and the master flip flop.

8. An electronic device, comprising:
   a plurality of internal data storage locations coupled to an electrical conductor in series;
   an analog-to-digital converter with an input coupled to the electrical conductor; and
   a digital filter with a multi-bit output and an input coupled to an output of the analog-to-digital converter, wherein the digital filter comprises memory distinct from filtering circuitry of the digital filter and configured to store a preset value utilized to initialize the digital filter.

9. The electronic device of claim 8, wherein the analog-to digital converter is configured to output a pulse-density modulated bit-stream that has an average value that is generally proportional to the current through the electrical conductor.

10. The electronic device of claim 8, wherein the analog-to-digital converter comprises:
   a comparator having a first input coupled to the electrical conductor, a second input coupled to a reference voltage source, and an output coupled to an input of the digital filter, wherein the comparator is configured to latch the output to logic high or logic low once per clock cycle based on whether the voltage of the first input is greater than the voltage of the second input; and
   a switch having a first terminal, a second terminal coupled to the electrical conductor, and a gate coupled to the output of the comparator; and
   a reference current source coupled to the first terminal of the switch.

11. The electronic device of claim 8, wherein the digital filter is a low-pass digital filter comprising a counter.

12. The electronic device of claim 11, wherein the counter comprises a plurality of cascaded flip-flops, wherein an input of one flip-flop of the plurality of flip-flops is coupled to an output of the analog-to-digital converter.

13. The electronic device of claim 12, wherein each of the flip-flops comprise SRAM configured to store a value in response to a store signal and transfer the value to the flip-flop in response to a transfer signal.

14. An electronic device, comprising:
   a bit-line;
   a memory element coupled to the bit-line;
   a quantizing circuit coupled to the memory element via the bit-line, wherein the quantizing circuit comprises:
      an analog-to-digital converter having an input and an output; and
      a digital filter comprising an internal memory distinct from filtering circuitry of the digital filter, wherein the input of the analog-to-digital converter is coupled to the bit-line, and the output of the analog-to-digital converter is coupled to the digital filter, wherein the internal memory is configured to store a preset value utilized to initialize the digital filter in the internal memory.

15. The electronic device of claim 14, wherein the analog-to-digital converter comprises a delta-sigma modulator.

16. The electronic device of claim 14, wherein the internal memory comprises static random access memory (SRAM).

17. The electronic device of claim 14, wherein the memory element comprises flash memory.

18. The electronic device of claim 14, wherein the digital filter comprises a counter.

19. The electronic device of claim 18, wherein the counter comprises a plurality of cascaded flip-flops, wherein an input of one flip-flop of the plurality of flip-flops is coupled to the output of the analog-to-digital converter.

20. The electronic device of claim 19, wherein each of the flip-flops comprise the internal memory, and wherein the electronic device is configured to store a value in the internal memory in response to a store signal and transfer the value to the flip-flop in response to a transfer signal.

* * * * *